United States Patent
Mizrahi

(10) Patent No.: US 12,520,416 B1
(45) Date of Patent: Jan. 6, 2026

(54) LIQUID COOLING ASSEMBLY FOR DUAL-SIDED THERMAL MANAGEMENT AND COMPUTING DEVICE INCLUDING THE SAME

(71) Applicant: NEXT SILICON LTD., Givatayim (IL)

(72) Inventor: Yehuda Mizrahi, Kfar Yona (IL)

(73) Assignee: NEXT SILICON LTD., Givatayim (IL)

( * ) Notice: Subject to any disclaimer, the term of this patent is extended or adjusted under 35 U.S.C. 154(b) by 0 days.

(21) Appl. No.: 19/216,235

(22) Filed: May 22, 2025

Related U.S. Application Data

(63) Continuation-in-part of application No. 19/058,176, filed on Feb. 20, 2025.

(51) Int. Cl.
*H05K 1/02* (2006.01)
*G06F 1/20* (2006.01)

(52) U.S. Cl.
CPC .............. *H05K 1/0204* (2013.01); *G06F 1/20* (2013.01); *H05K 2201/066* (2013.01)

(58) Field of Classification Search
CPC .......... H05K 7/20254; H05K 7/20218; H05K 7/20272; H05K 7/2049; H05K 1/0203; H05K 2201/066; H05K 7/20772; H05K 7/20927; H05K 7/20781; H01L 23/473; F28F 3/12
See application file for complete search history.

(56) References Cited

U.S. PATENT DOCUMENTS

| | | | | |
|---|---|---|---|---|
| 9,345,169 B1 * | 5/2016 | Campbell | .......... | H05K 7/20327 |
| 10,044,078 B2 * | 8/2018 | Jung | ................. | H01M 10/6551 |
| 10,477,731 B1 | 11/2019 | Fu et al. | | |
| 10,542,640 B1 * | 1/2020 | Leigh | ................. | H05K 7/20772 |
| 10,952,354 B1 * | 3/2021 | Chen | ....................... | H01L 23/46 |
| 2006/0002086 A1 * | 1/2006 | Teneketges | ........... | H01L 23/473 |
| | | | | 257/E23.098 |

(Continued)

OTHER PUBLICATIONS

Caravellex—"Why don't GPU's and CPU's cool from both sides?" (2020). Available online: [https://www.reddit.com/r/hardware/comments/htvtlg/why_dont_gpus_and_cpus_cool_from_both_sides/].

*Primary Examiner* — Adam B Dravininkas
(74) *Attorney, Agent, or Firm* — The Roy Gross Law Firm, LLC; Roy D. Gross

(57) ABSTRACT

The present invention relates to the technological field of microelectronics and electronic engineering, specifically to advanced liquid-cooling-based thermal management systems for electronic components on printed circuit boards. The present invention represents a liquid cooling assembly that provides an improvement to the technological field of microelectronics and electronic engineering, by providing an effective cooling solution for systems employing vertical power delivery. Specifically, it provides liquid cooling for electronic components located on both sides of the PCB while fitting within the spatial constraints of modern electronic devices. The invention further provides a computing device that includes such an improved liquid cooling assembly, thereby improving the aforementioned technological field by increasing device operation efficiency, specifically enabling prolonged and stable operation in computationally intensive regimes due to highly efficient thermal management.

19 Claims, 11 Drawing Sheets

(56) References Cited

U.S. PATENT DOCUMENTS

| | | |
|---|---|---|
| 2010/0277868 A1 | 11/2010 | Beaupre et al. |
| 2011/0021355 A1 | 1/2011 | Zank et al. |
| 2012/0212175 A1 | 8/2012 | Sharaf et al. |
| 2013/0025826 A1* | 1/2013 | Sakamoto ............. H01L 23/427 165/104.21 |
| 2014/0295228 A1* | 10/2014 | Yan .................... H01M 10/658 429/83 |
| 2015/0079442 A1* | 3/2015 | Haussmann ...... H01M 10/6556 429/120 |
| 2015/0318587 A1* | 11/2015 | Kim .................... H01M 10/425 320/112 |
| 2016/0183409 A1* | 6/2016 | Zhou .................. H01L 23/4735 165/104.31 |
| 2021/0176896 A1* | 6/2021 | Yang ................. H05K 7/20254 |
| 2021/0378147 A1* | 12/2021 | Chehade ............ H05K 7/20927 |
| 2022/0248560 A1* | 8/2022 | Zhou .................... H05K 7/2039 |
| 2022/0312637 A1 | 9/2022 | Norton et al. |
| 2022/0377940 A1 | 11/2022 | Yang et al. |
| 2023/0139202 A1 | 5/2023 | Zhou et al. |
| 2023/0422389 A1 | 12/2023 | Subrahmanyam et al. |

\* cited by examiner

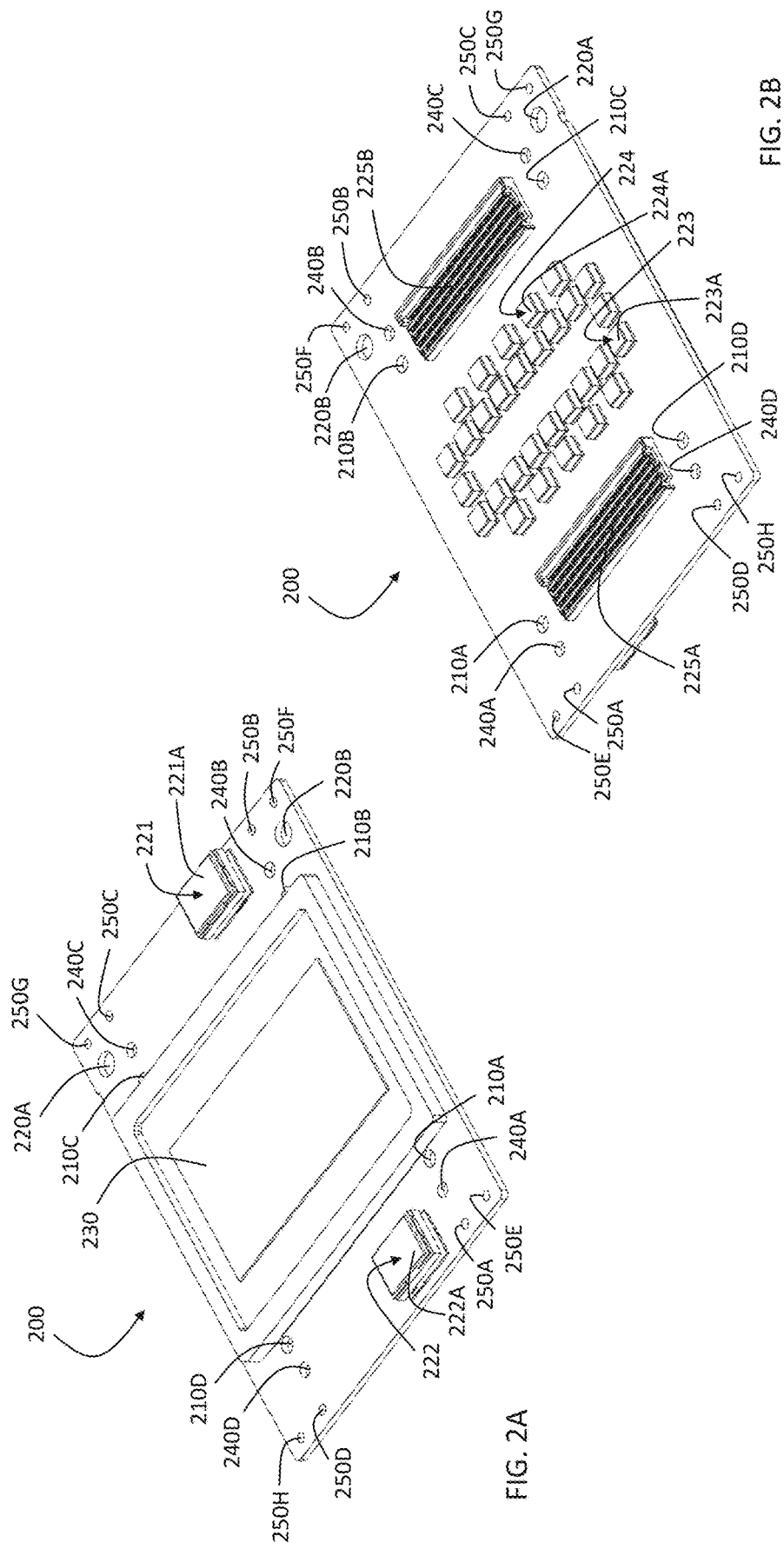

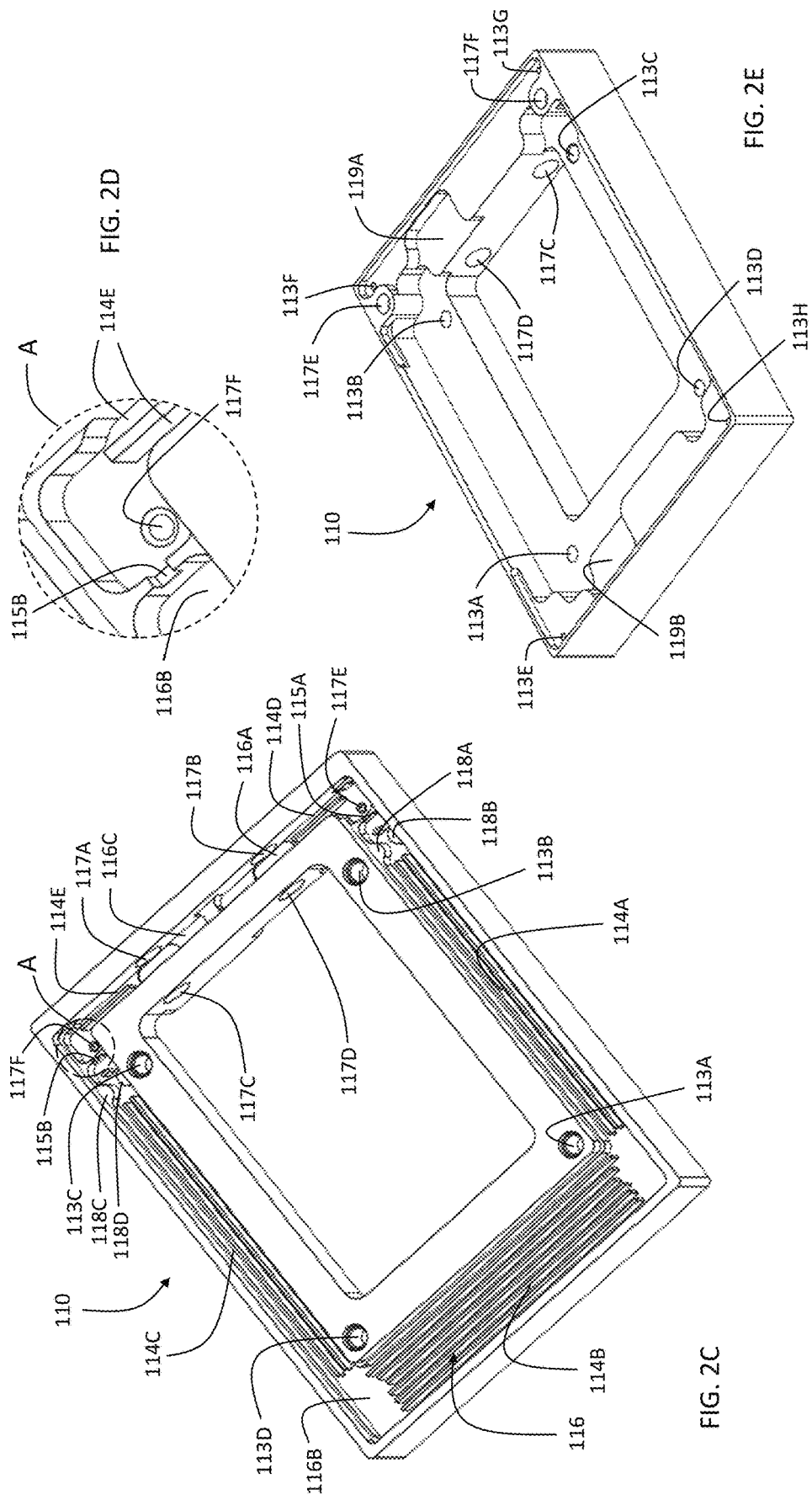

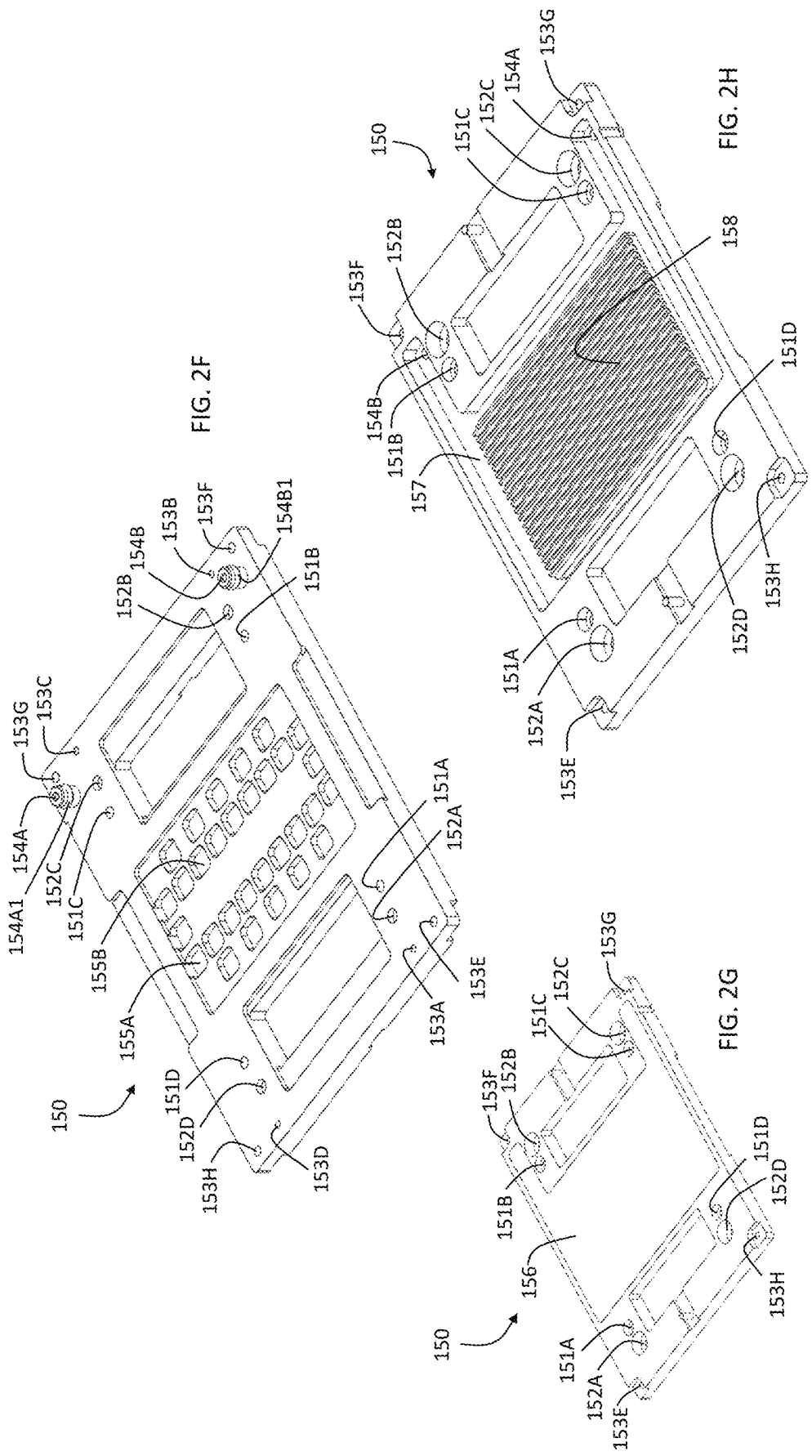

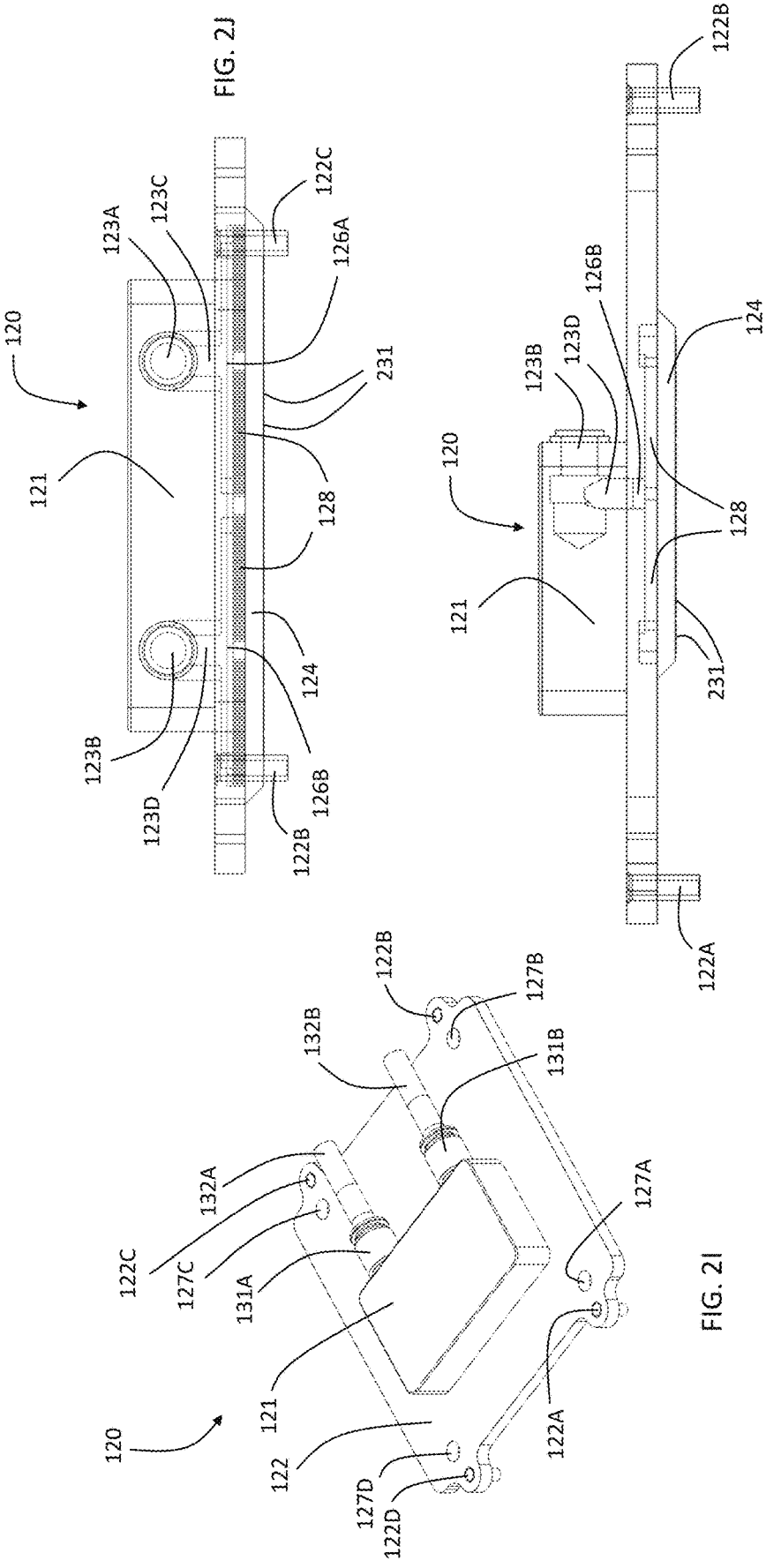

LIQUID COOLING ASSEMBLY FOR DUAL-SIDED THERMAL MANAGEMENT AND COMPUTING DEVICE INCLUDING THE SAME

CROSS-REFERENCE TO RELATED APPLICATIONS

This application is a Continuation-in-part of U.S. Utility application Ser. No. 19/058,176, titled "LIQUID COOLING ASSEMBLY FOR ELECTRONIC COMPONENTS ON PRINTED CIRCUIT BOARDS AND COMPUTING DEVICE INCLUDING SAME", filed Feb. 20, 2025, which is hereby incorporated by reference in its entirety.

FIELD OF THE INVENTION

The present invention relates to the technological field of microelectronics and electronic engineering, specifically to advanced liquid-cooling-based thermal management systems for electronic components on printed circuit boards.

BACKGROUND OF THE INVENTION

In the field of microelectronics and electronic engineering, efficient thermal management is crucial for ensuring optimal performance and longevity of electronic components. As electronic circuits become increasingly complex and densely packed, the challenge of dissipating heat effectively has intensified. Traditional cooling methods, such as air cooling with fans or passive solutions, often fall short in addressing the thermal demands of modern high-performance electronics. These conventional solutions can lead to overheating, reduced efficiency, and potential damage to sensitive components, necessitating the development of more advanced cooling technologies.

Liquid cooling systems have emerged as a promising alternative, offering superior heat dissipation capabilities by circulating a fluid to absorb and transfer heat away from components. However, the existing heat dissipation problem is further exacerbated by the fact that different components on the PCB may exhibit varying power densities, leading to significantly different heat dissipation requirements. Existing solutions often lack flexibility and adaptability, particularly in accommodating varying thermal loads across different parts of a system. This limitation can result in uneven cooling, inefficient energy use, and increased complexity in system design and maintenance.

Recently, vertical power delivery technology has emerged as an innovative approach in high-performance computing systems. This technology involves the vertical integration of power delivery components through the PCB, creating direct power paths between the power source and the components requiring power. By shortening the power delivery path, this technology significantly reduces power loss, improves power integrity, and enhances overall system efficiency. Additionally, vertical power delivery enables higher current densities and more precise voltage regulation, which are critical for powering advanced integrated circuits with increasingly demanding power requirements.

In addition to thermal management challenges, mechanical tolerances between various components of the printed circuit board (PCB) pose significant problems. These tolerances may arise from manufacturing limitations, such as soldering, leading to major heat-dissipative areas that are slightly unparallel. When using a single rigid cooling element, such as a heat sink, that must have proper contact with the heat-dissipating areas of multiple components simultaneously, any geometrical misalignment between the components can adversely affect the contact. As optimal thermal transfer relies on precise contact between the heat sink and the components, misalignment can dramatically reduce cooling efficiency.

Another important aspect to consider, alongside cooling efficiency, is the compactness of the design. In many cases, the volume inside the target device housing is limited, making it crucial to develop a cooling system that not only effectively manages heat but also fits within the spatial constraints of the device. This requires a balance between performance and design compactness to ensure that the cooling solution does not compromise the overall functionality and form factor of the electronic device.

SUMMARY OF THE INVENTION

The advent of vertical power delivery technology necessitates the development of a new design of heat management systems. Traditional cooling solutions are not optimized for the unique thermal challenges presented by this technology, caused by positioning of heat-generating components on both sides of the PCB. This dual-sided component arrangement requires a cooling solution that can effectively address thermal management needs on both sides of the board simultaneously.

Accordingly, there is a need for a liquid cooling assembly that would provide an improvement to the technological field of microelectronics and electronic engineering. Specifically, there is a need for an effective cooling solution for systems employing vertical power delivery that would provide liquid cooling for electronic components located on both sides of the PCB while fitting within the spatial constraints of modern electronic devices. There is further a need for a solution that is easily adjustable to mitigate mechanical tolerances between the different electrical components of the target PCB and adaptable to address the diverse thermal loads presented by them, while maintaining the compactness of the design. Such a solution would thereby increase the overall heat dissipation efficiency of thermal management systems and represent a substantial advancement in thermal management technology for next-generation computing systems. There is further a need for a computing device that includes such an improved liquid cooling assembly, which would improve the aforementioned technological field by increasing device operation efficiency, specifically enabling prolonged and stable operation in computationally intensive regimes due to highly efficient thermal management.

To address the aforementioned needs, the following is suggested.

In the general aspect, the present invention may be directed to a liquid cooling assembly. The liquid cooling assembly may include at least one first heat sink, configured to be thermally coupled to at least one first electronic component; and at least one second heat sink, configured to be thermally coupled to at least one second electronic component. Said at least one first heat sink and said at least one second heat sink may be configured to be assembled on the opposite sides of a printed circuit board (PCB). Said at least one first heat sink may have an inner cavity fluidically connectable to a liquid coolant distribution unit and configured to form therewith a first liquid coolant circulation pathway. Said at least one second heat sink may have an inner cavity configured to be fluidically connected to the inner cavity of said at least one first heat sink and to form, together with the liquid coolant distribution unit, a second liquid coolant circulation pathway, while sharing, with the first liquid coolant circulation pathway, a common inlet and outlet connection to the liquid coolant distribution unit, when the liquid cooling assembly is in an assembled state. The inner cavity of said at least one first heat sink may be configured to be fluidically connected to the inner cavity of said at least one second heat sink via an inlet communication channel and an outlet communication channel, through at least one mounting opening or at least one recess of the PCB.

In another general aspect, the present invention may be directed to a computing device. The computing device may include: a printed circuit board (PCB) including: (i) at least one first electronic component and at least one second electronic component mounted on opposite sides thereof; and (ii) at least one mounting opening or at least one recess; at least one first heat sink thermally coupled to said at least one first electronic component; and at least one second heat sink thermally coupled to said at least one second electronic component. Said at least one first heat sink may have an inner cavity fluidically connectable to a liquid coolant distribution unit and configured to form therewith a first liquid coolant circulation pathway. Said at least one second heat sink may include an inner cavity fluidically connected to the inner cavity of said at least one first heat sink via an inlet communication channel and an outlet communication channel, through said at least one mounting opening or at least one recess. The inner cavity of said at least one second heat sink may be further configured to form, together with the liquid coolant distribution unit, a second liquid coolant circulation pathway, while sharing, with the first liquid coolant circulation pathway, a common inlet and outlet connection to the liquid coolant distribution unit.

In some embodiments, each of said inlet communication channel and said outlet communication channel may be in permanent connection to one of (a) the inner cavity of said at least one first heat sink and (b) the inner cavity of said at least one second heat sink, and configured to provide, in the assembled state, a detachable fluid-tight connection to another of (a) the inner cavity of said at least one first heat sink and (b) the inner cavity of said at least one second heat sink, respectively.

In some embodiments, the liquid cooling assembly may further include at least one third heat sink, configured to be thermally coupled to at least one third electronic component. Said at least one third heat sink may have an inner cavity in flexible fluid connection with the inner cavity of said at least one first heat sink and configured to form, together with the liquid coolant distribution unit, a third liquid coolant circulation pathway, while sharing, with the first and second liquid coolant circulation pathways, a common inlet and outlet connection to the liquid coolant distribution unit.

In some embodiments, said at least one first heat sink may have a frame-shaped structure sized corresponding to dimensions of a peripheral area of the PCB; and said at least one third heat sink may be configured to be positioned substantially within said frame-shaped structure, when the liquid cooling assembly is attached to the PCB.

In some embodiments, said flexible fluid connection may include at least one flexible inlet tube and at least one flexible outlet tube fluidically connecting the inner cavity of said at least one third heat sink with the inner cavity of said at least one first heat sink from the inner side of the frame-shaped structure.

In some embodiments, said at least one first heat sink and said at least one third heat sink may each be configured to be thermally coupled to said at least one first electronic component and said at least one third electronic component, respectively, by being pressed onto heat-dissipating areas thereof using mechanically isolated groups of tightening elements.

In some embodiments, the liquid cooling assembly may further include a base member having at least two groups of mounting openings, each comprising at least one mounting opening. The mechanically isolated groups of tightening elements may include: a first group of fastening elements configured to fix, in the assembled state, said at least one first heat sink to the base member through a first group of mounting openings of the base member and a respective group of mounting openings of the PCB, and to substantially uniformly press the first heat sink onto the heat-dissipating area of said at least one first electronic component, when being tightened; and a second group of fastening elements configured to fix, in the assembled state, said at least one third heat sink to the base member through a second group of mounting openings of the base member and a respective group of mounting openings of the PCB, said second group of fastening elements including resilient elements and being configured to substantially uniformly press the third heat sink onto the heat-dissipating area of said at least one third electronic component, when being tightened.

In some embodiments, said at least one second heat sink may be integrated into the base member.

In some embodiments, at least one of said first heat sink or said third heat sink may include a plurality of standoffs distancing, in the assembled state, a respective heat sink from the PCB and including openings configured to receive a respective group of fastening elements.

In some embodiments, said standoffs and said fastening elements may be configured so as avoid mechanical interference with the PCB.

In some embodiments, said at least one first heat sink, and said at least one second heat sink, may be configured to be thermally coupled to said at least one first electronic component and said at least one second electronic component, respectively, via thermal pads attached to heat-dissipating areas thereof, and said at least one third heat sink may be configured to be thermally coupled to said at least one third electronic component, via a thermal paste covering heat-dissipating area thereof.

In some embodiments, the liquid cooling assembly may be further configured to split an input liquid coolant flow, passing through the common inlet connection, between said first liquid coolant circulation pathway, said second liquid coolant circulation pathway and said third liquid coolant circulation pathway in a predefined ratio.

In some embodiments, said predefined ratio may be defined corresponding to an expected power consumption ratio between said at least one first electronic component, said at least one second electronic component, and said at least one third electronic component.

In some embodiments, the liquid cooling assembly may be further configured to split the input liquid coolant flow by directing a first portion thereof through an input channel of said at least one first heat sink, a second portion thereof through an input channel of said at least one second heat sink, and a third portion thereof through an input channel of said at least one third heat sink, the input channel of said at least one first heat sink, the input channel of said at least one second heat sink, and the input channel of said at least one third heat sink being sized corresponding to said predefined ratio.

In some embodiments, at least one of (i) said at least one first heat sink, (ii) said at least one second heat sink, and (iii)

said at least one third heat sink may include an input channel and an output channel adjacent to an upper wall of the inner cavity of said at least one first heat sink, said at least one second heat sink, and said at least one third heat sink, respectively.

In some embodiments, the inner cavity of at least one of (i) said at least one first heat sink, (ii) said at least one second heat sink, and (iii) said at least one third heat sink may include a plurality of inner channels and is shaped so as to distribute a liquid coolant flow passing therethrough substantially evenly between the plurality of inner channels thereof.

In some embodiments, at least one of said at least one first heat sink, said at least one second heat sink, and said at least one third heat sink is configured to be thermally coupled to said at least one first electronic component, said at least one second electronic component, and said at least one third electronic component, respectively, via a direct-to-chip (D2C) liquid cooling configuration.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2A is an isometric view of the top side of a PCB, according to some embodiments of the present invention;

FIG. 2B is an isometric view of the bottom side of the PCB, according to some embodiments of the present invention;

FIG. 2C is an isometric view of the top side of a first heat sink, according to some embodiments of the present invention;

FIG. 2D is an enlarged isometric view of the output channel of the first heat sink, according to some embodiments of the present invention;

FIG. 2E is an isometric view of the bottom side of the first heat sink, according to some embodiments of the present invention;

FIG. 2F is an isometric view of the top side of a second heat sink, according to some embodiments of the present invention;

FIG. 2G is an isometric view of the bottom side of the second heat sink of the liquid cooling assembly, according to some embodiments of the present invention;

FIG. 2H is an isometric view of the bottom side of the second heat sink of the liquid cooling assembly (without the cover), according to some embodiments of the present invention;

FIG. 2I is an isometric view of the top side of a third heat sink connected to the inlet and outlet flexible tubes, according to some embodiments of the present invention;

FIG. 2J is a front view of the third heat sink (shown transparent), according to some embodiments of the present invention;

FIG. 2K is a side view of the third heat sink (shown transparent), according to some embodiments of the present invention;

Figure 1:
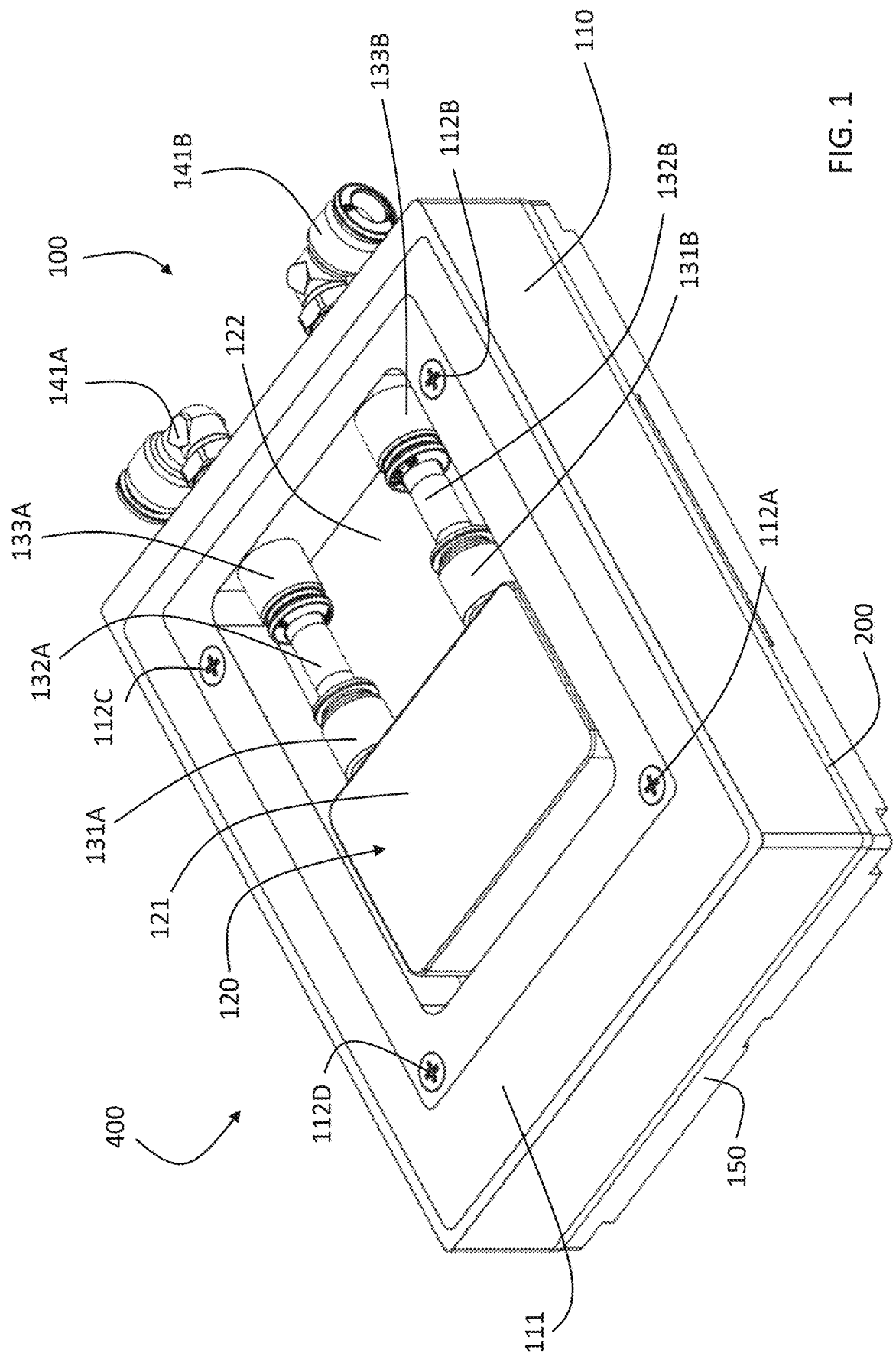
FIG. 1 is an isometric view of a liquid cooling assembly and a computing device, according to some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention. Some features or elements described with respect to one embodiment may be combined with features or elements described with respect to other embodiments. For the sake of clarity, discussion of same or similar features or elements may not be repeated.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term "set" when used herein may include one or more items.

As used herein, the term "fluid connection" refers to a path which allows fluid to flow between two components of the system of the present invention, wherein said two components can be directly or indirectly joined to each other. Similarly, as used herein, the terms "fluidically coupled", "fluidically connected" or "fluidically connectable" refer to a connection between two components that allows fluid to flow from one component to the other, wherein said connection may be direct or indirect (via intermediate components) enabling fluid flow therethrough.

In the context of the present invention, the term "flexible fluid connection" shall be understood as referring to a mechanically flexible connection that enables the transfer of fluids between connectable components. For example, such a connection may be implemented using flexible tubes or similar components which can deform to mitigate mechanical tolerances and misalignments between the connected components, while maintaining a fluid pathway therebetween.

In some embodiments of the present invention, the terms "central area" and "peripheral area" (e.g., in relation to a printed circuit board (PCB)) are used to describe the relative positioning of at least two elements with respect to the geometrical center of another element. For example, if a first electronic component is described as being located in the central area of the PCB, and a second electronic component is described as being in the peripheral area, this indicates that the first component is positioned closer to the geometrical center of the PCB than the second component. It should be understood that such terms do not impose any specific limitations on the exact distance from the center, and the use of "central" or "peripheral" should not be construed as limiting the scope of the present disclosure in this regard.

It should be understood that the terms 'first', 'second' and 'third' are used solely to differentiate between elements unambiguously and do not imply any specific order or sequence unless explicitly stated otherwise.

Unless explicitly stated, the method embodiments described herein are not constrained to a particular order or sequence. Additionally, some of the described method embodiments or elements thereof can occur or be performed simultaneously, at the same point in time, concurrently, or iteratively and repeatedly.

According to a concept of some embodiments of the present invention, the suggested configuration allows for efficient thermal management for the solutions applying vertical power delivery technology by enabling separate cooling pathways for the electronic components, which are located from opposite sides of the PCB and have varying thermal density. By sharing a common inlet and outlet, the system simplifies the design and reduces the complexity of the cooling assembly, making the assembly more compact and easier to integrate into electronic devices with limited space.

As further suggested herein, optionally, a fluid connection between the heat sinks provides adaptability to mechanical tolerances and misalignments on the PCB, ensuring effective thermal contact and heat dissipation.

Thereby, the suggested liquid cooling assembly may enhance the overall heat dissipation efficiency, addressing the diverse thermal requirements of modern high-performance electronics.

Accordingly, the computing device that includes such an improved liquid cooling assembly, as suggested herein, may provide prolonged and stable operation in computationally intensive regimes due to highly efficient thermal management, while having a compact design.

Reference is now made to FIG. 1, showing an isometric view of liquid cooling assembly 100 and computing device 400, according to some embodiments of the present invention.

For the purpose of clarity and conciseness, the following description may, in some respects, relate solely to the liquid cooling assembly. However, it shall be understood that the same principles and descriptions may be equally applied to the suggested computing device, as it may include the liquid cooling assembly in all embodiments discussed herein.

Furthermore, for the purpose of clarity and conciseness, the description of similar or identical components shown in the provided Figures may be omitted.

As shown in FIG. 1, in some embodiments, computing device 400 may include printed circuit board (PCB) 200 including a plurality of electronic components mounted thereon, in particular, components mounted on opposite sides thereof (described in detail with reference to FIGS. 2A and 2B).

Printed circuit boards (PCBs) are foundational components in electronic devices, serving as platforms for mounting and interconnecting various electronic components. PCB (such as PCB 200) usually consist of a non-conductive substrate, typically made of fiberglass, composite epoxy, or other laminate materials, onto which conductive pathways are etched or printed. These pathways, often made of copper, facilitate electrical connections between electrical components installed thereon.

As known, heat sinks are essential components in thermal management systems for PCBs. They are commonly designed to dissipate heat generated by electronic components, such as microprocessors and power transistors, to prevent overheating and ensure optimal performance.

In some embodiments, liquid cooling assembly 100 may include at least one first heat sink (e.g., heat sink 110), at least one second heat sink (e.g., heat sink 150), and at least one third heat sink (e.g., heat sink 120).

In some embodiments, heat sink 110 may have a frame-shaped structure sized corresponding to the dimensions of the peripheral area of PCB 200, as shown in FIG. 1.

In some embodiments, heat sink 120 may be configured so as to be positioned substantially within the frame-shaped structure of heat sink 110, when liquid cooling assembly 100 is attached to PCB 200 (i.e., when device 400 is in the assembled state, as shown in FIG. 1).

In some embodiments, heat sink 150 may be positioned from the bottom (opposite) side of PCB 200, across from heat sinks 110 and 120 (i.e., when device 400 is in the assembled state, as shown in FIG. 1).

For the purpose of clarity, in the example shown in the Figures and throughout the present disclosure, the 'first' heat sink is referred to as heat sink 110, the 'second' heat sink is referred to as heat sink 150, and the 'third' heat sink is referred to as heat sink 120. However, such references shall not be considered as imposing any constraints on the scope of the present invention as set by the appended set of claims. For example, in some alternative embodiments, the 'first' heat sink may be heat sink 120, the 'second' heat sink may be heat sink 150, and the 'third' heat sink may be heat sink 110.

In some embodiments, heat sink 120 may include portions 121 and 122 (explained in greater detail with reference to FIGS. 2I-2L).

In some embodiments, liquid cooling assembly 200 may further include at least one flexible inlet tube 132B and at least one flexible outlet tube 132A. In some embodiments, heat sinks 110, 150 and 120 may have inner cavities for liquid coolant circulation (e.g., inner cavity 116, inner cavity 157, and inner cavity 126, shown in FIGS. 2C, 2H and 2L, respectively). In some embodiments, tubes 132A and 132B may fluidically connect the inner cavities of heat sinks 110 and 120 from the inner side of the frame-shaped structure, as shown in FIG. 1. Tube 132A may be connected to the inner cavities 116 and 126 of heat sinks 110 and 120 via fittings 133A and 131A, respectively. Tube 132B may be connected to the inner cavities 116 and 126 of heat sinks 110 and 120 via fittings 133B and 131B, respectively.

In some embodiments, inner cavity 116 (explained in detail with reference to FIG. 2B) of heat sink 110 may be closed, from the upper side, with cover 111. Cover 111 may be welded to the main body of heat sink 110 to hermetically seal inner cavity 116.

In some embodiments, heat sinks 110, 150 and 120 may be made from materials with high thermal conductivity, like aluminum or copper, as commonly known in the art.

In some embodiments, heat sink 110, and/or heat sink 150, and/or heat sink 120 may also be referred to as cold plates. Both "heat sinks" and "cold plates" are commonly known names for such components of thermal management systems, and may be used interchangeably in the present context.

In some embodiments, liquid cooling assembly 100 may further include a base member which, in the assembled state of assembly 100, may be positioned adjacent to the bottom side of PCB 200. In certain embodiments (e.g., as illustrated in the Figures), the second heat sink (heat sink 150) may be integrated with, or serve as, the base member, thereby forming a single structural element. Accordingly, in such configurations, heat sink 150 may facilitate the attachment of heat sinks 110 and 120 to PCB 200, while avoiding unnecessary mechanical interferences therebetween, thereby ensuring high efficiency of heat dissipation. E.g., heat sink 110 may be attached to heat sink 150 via fastening elements (e.g., screws 250E1-250H1), shown in FIG. 3A.

In some embodiments, heat sink 150 (when integrated with the base member) may function (and referred to) as a stiffener—a standard OEM element, a mechanical component used in printed circuit boards (PCBs) to provide additional support and rigidity. As known in the art, stiffener is not an electrical part of the PCB but serves to reinforce areas that need to be more stable. This may be particularly useful in flexible PCBs, where the stiffener helps to maintain the integrity of solder joints and supports components that might otherwise stress the flexible material.

It should be understood that, in some alternative embodiments (not shown), the base member may be implemented as a separate element. In such cases, heat sink 150 may be either detachably connectable to the base member or directly connectable to PCB 200, without requiring any mechanical connection to the base member.

Figure 4A:
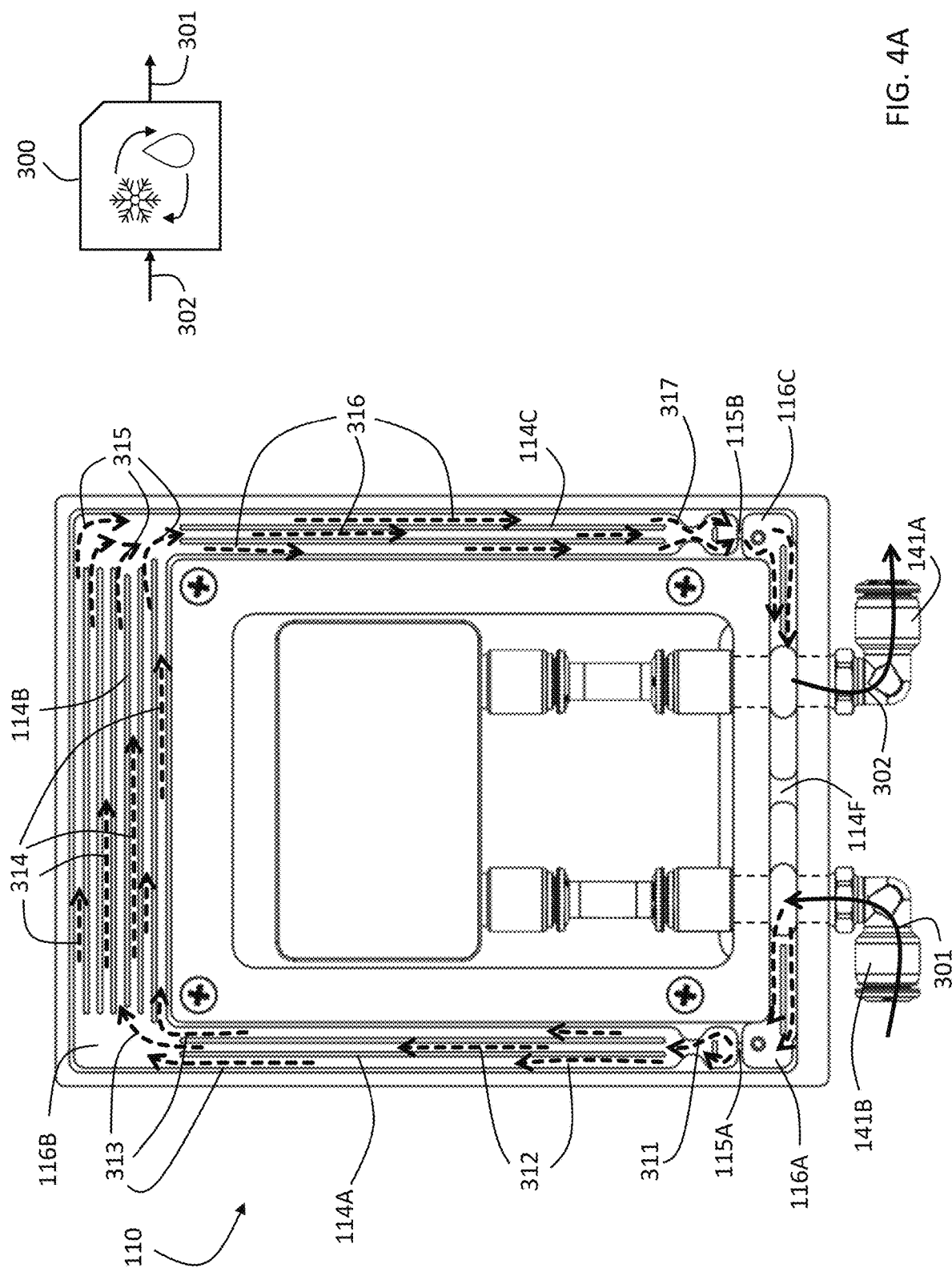
FIG. 4A is a top view of the liquid cooling assembly having the first heat sink shown partially transparent, illustrating the first liquid coolant circulation pathway, according to some embodiments of the present invention.
Figure 4B:
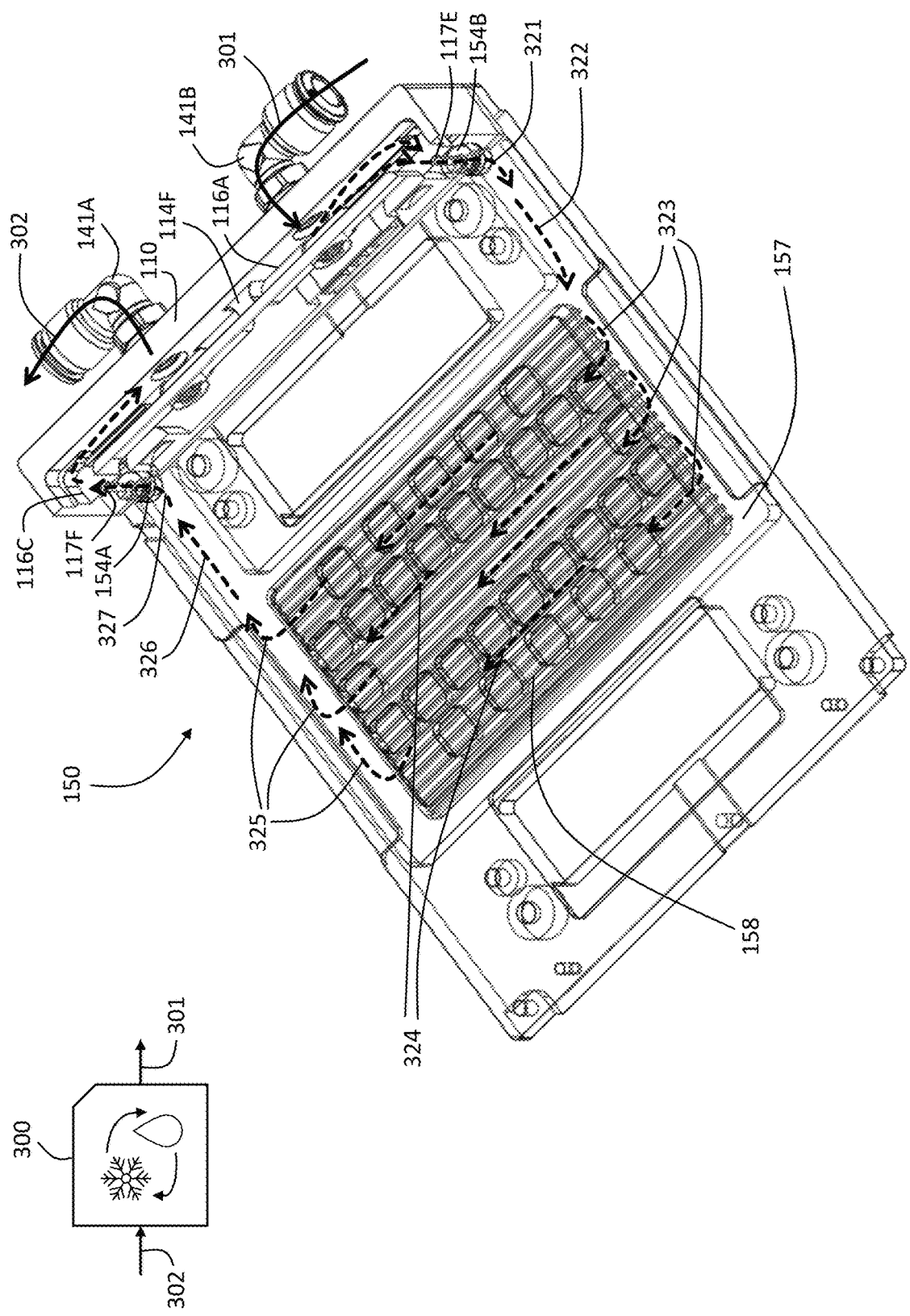
FIG. 4B is an isometric view of the liquid cooling assembly having the second heat sink shown partially transparent, illustrating the second liquid coolant circulation pathway, according to some embodiments of the present invention.
Figure 4C:
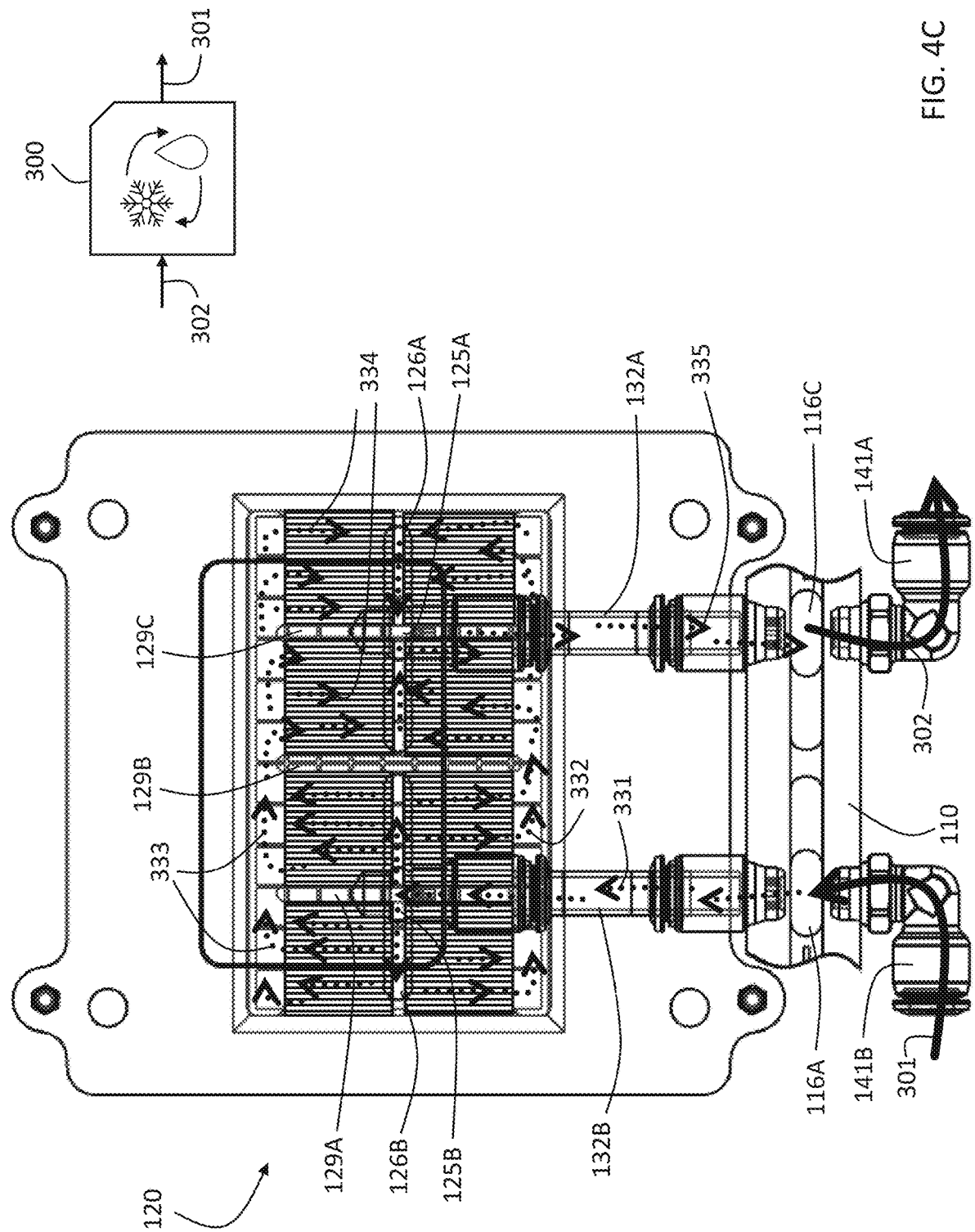
FIG. 4C is a top view of the liquid cooling assembly having the third heat sink shown partially transparent, illustrating the third liquid coolant circulation pathway, according to some embodiments of the present invention.

In some embodiments, liquid cooling assembly 100 may be fluidically connectable to a liquid coolant distribution unit (e.g., liquid coolant distribution unit 300, schematically shown in FIGS. 4A-4C), e.g., via inlet and outlet fittings 141B and 141A, respectively (also referred herein as inlet and outlet connection).

As known, liquid coolant distribution unit (CDU) is a critical component in thermal management of computer systems, particularly for data centers. Its primary function is to manage and regulate the distribution of coolants to ensure efficient thermal management. Accordingly, in some embodiments, computing device 400 may be part of a larger system, with the CDU operatively connected to multiple components of that system simultaneously.

In some embodiments, computing device 400 may be further connectable to a mother board (also referred to as Universal Base Board (UBB)), e.g., via high-speed connectors 225A and 225B located on the bottom part of PCB 200 (as shown in FIG. 2B). Such high-speed connectors may require a strong physical connection to operate properly. To ensure such a connection, computing device 200 may be configured to be secured to the mother board, e.g., via fastening elements (screws 112A-112D).

As illustrated in the Figures, in some embodiments, said heat sinks 110, 150 and 120 may be configured to be thermally coupled to a group of power-intensive components 221 and 222 (shown in FIG. 2A, also referred to herein as "at least one first electronic component" or "a first group of ancillary electronic components"), a group of power-intensive components 223 and 224 (shown in FIG. 2B, also referred to herein as "at least one second electronic component" or "a second group of ancillary electronic components"); and integrated circuit (IC) 230 (shown in FIG. 2A, also referred to herein as "at least one third electronic component"), respectively, via a direct-to-chip (D2C) liquid cooling configuration.

As used herein, the term direct-to-chip (D2C) liquid cooling configuration refers to a cooling arrangement in which one or more liquid-cooled heat sinks (e.g., heat sinks 110, 120 and 150) are placed in direct thermal contact with the surfaces of electronic components (e.g., components 221-224 and IC 230), typically via a thermal interface material such as thermal paste or a thermal pad. In such configurations, the liquid coolant circulates within internal cavities of the heat sinks and does not come into direct contact with the electronic components or the printed circuit board (PCB). This should be clearly distinguished from immersion cooling, in which the entire electronic assembly is submerged in a dielectric liquid coolant.

The components of liquid cooling assembly 100 and computing device 400 are further described in greater detail with reference to FIGS. 2A-2L.

FIG. 2A illustrates PCB 200 (top side), according to some embodiments of the present invention. It shall be understood that the embodiment of PCB 200 shown herein is provided as a non-exclusive example and for illustration purposes only. The provided embodiment of PCB 200 is intended to clarify how electronic components requiring thermal management may be positioned and how the design of liquid cooling assembly 100 can be adapted to the PCB layout topology to effectively dissipate heat. Furthermore, when discussing computing device 400, the concept of the present invention primarily relates to thermal management aspects, which may potentially improve the performance of a wide variety of computing devices. Hence, the present invention does not relate to any particular functions of computing device 400. Accordingly, the present invention shall not be considered limited to any specific type of computing device or intended use thereof, nor to any particular PCB or its intended use.

PCB 200 may include a wide array of components such as resistors, capacitors, diodes, transistors, and integrated circuits (ICs), each serving specific functions within the electronic system. Additionally, in some embodiments, PCB 200 can incorporate connectors (e.g., connectors 225A and 225B), switches, and other mechanical components to interface with external devices or systems. As known, PCB design plays a crucial role in creating customized liquid cooling assembly, as it determines the layout and arrangement of the components, impacting the overall performance, reliability, heat dissipation characteristics and manufacturability of the electronic device.

In some embodiments, PCB 200 may include power-intensive electronic components requiring thermal management for normal operation.

In some particular embodiments, PCB 200 may include integrated circuit (IC) 230 mounted in the central area of PCB 200, on the top side thereof. In some embodiments, IC 230 may be a SoC (System on Chip), an FPGA (Field-Programmable Gate Array), an ASIC (Application-Specific Integrated Circuit), an ASSP (Application-Specific Standard Product) or similar electronic component known in the field. IC 230 may perform data processing, memory storage, signal processing, power management or other functions, as known in the field.

In some particular embodiments, PCB 200 may further include a group of ancillary electronic components mounted thereon. In some embodiments, ancillary electronic components may include various elements mounted in the peripheral area of PCB 200, such as power transistors, resistors, capacitors, inductors, diodes, connectors, and may also include ancillary chips, controllers or similar components that configured to support the primary function of IC 230. The group of ancillary electronic components may include power-intensive components 221 and 222 mounted on the top side of PCB 200, and a group of power-intensive components mounted on the bottom side of PCB 200 (e.g., components 223, and 224). Components 221, 222, 223 and 224 may require heat dissipation for maintaining normal operation.

In some embodiments, PCB 200 may include several groups of mounting openings. E.g., the first group, comprising mounting openings 250E-250H, may be configured for the attachment of heat sink 110, as detailed in FIG. 3A. The second group, comprising mounting openings 240A-240D, may be configured for the attachment of heat sink 120, as detailed in FIG. 3B. The third group, comprising mounting openings 250A-250D, may be configured for the attachment of heat sink 150, as shown in FIGS. 3A and 3B. The fourth group, comprising mounting openings 210A-210D, may be configured for the attachment of device 400 to the mother board (UBB) (the assembly is partially shown in FIG. 3A). In some embodiments, PCB 200 may further include a pair of mounting openings 220A and 220B, configured to establish fluidical connection between inner cavity 116 of heat sink 110 and inner cavity 157 of heat sink 150, as further explained with reference to FIGS. 2E, 2F and 4B.

Reference is now made to FIGS. 2C-2E, showing aspects of heat sink 110, in some embodiments of the present invention.

As shown in FIG. 2C, illustrates an isometric view of the top side of heat sink 110, according to some embodiments of the present invention.

As shown in FIG. 2C, heat sink 110 may have inner cavity 116 around the perimeter of its frame-shaped structure. Inner cavity 116 may be divided into sections 116A, 116B and 116C. Section 116A may be connected to section 116B via input channel 115A. Section 116B may be connected to section 116C via output channel 115B. In section 116A, heat sink 110 may further include inlet opening 117B. In section 116C, heat sink 110 may further include outlet opening 117A. Inner cavity 116 may be fluidically connectable to the liquid coolant distribution unit (e.g., liquid coolant distribution unit 300, shown in FIGS. 4A-4C) and configured to form therewith a liquid coolant circulation pathway (also referred herein as the "first" liquid coolant circulation pathway), e.g., from liquid coolant distribution unit via inlet opening 117B to section 116A—via input channel 115A to section 116B—via output channel 115B to section 116C—via outlet opening 117A to liquid coolant distribution unit. The aspects of liquid coolant circulation are further explained in greater detail with reference to FIG. 4A. By providing liquid coolant circulation around the frame-shaped structure, assembly 100 allows efficient heat dissipation from the electronic components thermally coupled to heat sink 110.

In some embodiments, inner cavity 116 may include a plurality of inner channels 114A-114E. Inner cavity 116 may be shaped so as to distribute the liquid coolant flow passing therethrough substantially evenly between the plurality of inner channels thereof. E.g., in some embodiments, heat sink 110 may have projections 118A-118D, that are configured to direct the flow so as to distribute it between the respective inner channels 114A-114E (further explained in greater detail with reference to FIG. 4A).

As shown in FIG. 2C, inner channels 114A-114E may be formed by a series of separating inner walls positioned along the flow direction. This configuration not only ensures even flow distribution but also significantly increases the heat-conducting area of heat sink 110 in direct contact with the liquid coolant flow, thereby enhancing heat dissipation efficiency.

In some embodiments, heat sink 110 may further include openings 117E and 117F, located in sections 116A and 116C, respectively, and configured to provide fluidical connection between inner cavity 116 of heat sink 110 and inner cavity 157 of heat sink 150 (as further explained with reference to FIGS. 2F and 4B). From the inner side of the frame-shaped structure, heat sink 110 may further include openings 117C and 117D to provide fluid connection with heat sink 120 (not shown). Thereby, section 116A of inner cavity 116 may be configured so that the flow entering through inlet opening 117B is divided into three pathways: the first goes via input channel 115A through section 116B of inner cavity 116; the second goes via opening 117E to heat sink 150, and the third goes via opening 117D and tube 132B (not shown) to heat sink 120. Section 116C, in turn, may be configured so that the flow, after passing through section 116B of inner cavity 116, enters through output channel 115B and exits through outlet opening 117A, mixing with the flow returning from heat sink 150 via opening 117F and the flow returning from heat sink 120 via tube 132A (not shown) and opening 117C.

Heat sink 110 may also include through mounting openings 113A-113D for mounting the entire computing device 400 on the mother board (not shown) using fastening elements (e.g., screws 112A-112D) (not shown).

FIG. 2D is an enlarged isometric view (marked "A" in FIG. 2C) of output channel 115B connecting sections 116B and 116C of inner cavity 116, according to some embodiments of the present invention. FIG. 2D also shows two inner channels 114E separated by the inner wall, as well as opening 117F. It shall be understood that input channel 115A, inner channels 114D, and opening 117E may have a configuration symmetrical to the configuration shown in FIG. 2D.

It should be understood that, although in FIGS. 2C and 2D the elements positioned inside cavity 116, such as channels 114A-114E and channels 115A and 115B, appear without an upper wall, heat sink 110 may be configured so that, when covered with cover 111 (as shown in FIG. 1), the upper wall of these elements is formed by the inner side of cover 111. Accordingly, with cover 111 in place, each of channels 114A-114E and 115A-115B may have a closed or substantially closed shape (e.g., rectangular) in cross-section.

FIG. 2E is an isometric view of the bottom side of heat sink 110, according to some embodiments of the present invention. As shown in FIG. 2E, from the bottom side, heat sink 110 may include contact surfaces 119A and 119B, configured so as to be thermally coupled with heat dissipating areas of respective ancillary electronic components 221 and 222 of PCB 200 (e.g., surface 119A may be coupled with component 221, and surface 119B may be coupled with component 222).

In some embodiments, to perform said thermal coupling, thermal pads 221A and 222A may be used (shown in FIG. 2A).

As known in the art, thermal pads are soft, thermally conductive materials used to fill gaps between heat-generating components and heat sinks. They help improve heat transfer and ensure efficient thermal management in electronic devices. In some embodiments, thermal pads may be made from silicone or other thermally conductive materials, infused with ceramic or metallic particles to enhance thermal conductivity. Thermal pads may therefore provide a conformal interface between uneven surfaces (e.g., contact surfaces 119A-119B and surfaces of respective components 221-222), ensuring good thermal contact along the entire heat dissipating area and reducing thermal resistance.

In some embodiments, by having contact surfaces 119A and 119B sized and positioned accordingly to the layout and dimensions of components 221 and 222, heat sink 110 may be configured to be thermally coupled to these components, e.g., via thermal pads 221A and 222A attached to heat-dissipating areas thereof, respectively. In some embodiments, thermal pads 221A and 222A may have thickness allowing to mitigate insignificant mechanical tolerances of the interposition of components 221 and 222, e.g., caused by manufacturing (e.g., soldering) constraints.

Accordingly, it should be understood that, depending on specific embodiments, heat sink 110 may be custom-designed to match the specific configuration, layout, and content of the electronic components on the target PCB (such as PCB 200), to meet its thermal management requirements.

In the context of the present description, the term "contact surfaces" applies to thermal coupling and shall not be confused with contact surfaces applied for electrical coupling.

As shown in FIG. 2E, in some embodiments, heat sink 110 may include, on the bottom side, openings 113E-113H, configured for securing heat sink 110 to PCB 200 and heat sink 150, e.g., using fastening elements (e.g., by threading screws 250E1-250H1) (as shown and explained with reference to FIG. 3A.

In some embodiments, cover 111 (shown in FIG. 1) may be made from the same material as heat sink 110 (e.g., aluminum or copper).

During the manufacturing process of liquid cooling assembly 100, a blank of the desired material with approximate dimensions of the target heat sink 110 may be taken. The blank is then machined to achieve the desired dimensions and to form inner cavity 116 and contact surfaces 119A and 119B. Next, openings 117A-117F and 113A-113H may be drilled, and openings 113E-113H may be further threaded. Afterward, cover 111, machined to match the dimensions of inner cavity 116, is positioned to cover cavity 116 and welded along its perimeter to seal the inner volume of cavity 116 and complete the form of channels 114A-114E and 115A-115B. Finally, the inner cavity 116 may be washed under high pressure via openings 117A-117D, to remove any debris left from the machining process.

FIGS. 2F-2H show isometric views of heat sink 150 of liquid cooling assembly 100, according to some embodiments of the present invention.

Heat sink 150 (integrated into the base member) may have groups of mounting openings, each configured to align with a respective group of mounting openings on PCB 200 when base member 150 is positioned adjacent to the bottom side of PCB 200. This positioning is shown in greater detail in FIGS. 3A-3B.

For example, the first group of mounting openings 250E-250H on PCB 200 (shown in FIG. 2A) may align with the first group of mounting openings 153E-153H on heat sink 150, and the second group of mounting openings 240A-240D on PCB 200 (shown in FIG. 2A) may align with the second group of mounting openings 152A-152D on base member 150.

In some embodiments, the third group of mounting openings 250A-250D on PCB 200 (shown in FIG. 2A) may align with the third group of mounting openings 153A-153D on heat sink 150. The fourth group of mounting openings 210A-210D on PCB 200 (shown in FIG. 2A) may align with the fourth group of mounting openings 151A-151D on heat sink 150.

As demonstrated herein, element 150 may perform multiple functions. For example, element 150 may function as a mating part for connecting heat sinks 110 and 120 to PCB 200, while avoiding or mitigating mechanical interference of undesired components (e.g., springs 122A1-122D1 and screws 122A2-122D2, shown in FIG. 3B) with PCB 200 to prevent thermal interference therebetween. At the same time, element 150 may also function as a stiffener, enhancing the rigidity of PCB 200 and preventing its bending. This, in turn, may significantly improve the reliability of the PCB and maintain the integrity of the thermal coupling of heat sinks 110, 120 and 150. Finally, element 150 may function as a heat sink (heat sink 150), dissipating heat from electronic components 223 and 224 located on the bottom side of PCB 200. This multifunctional application provides a synergistic effect, further contributing to the improvement of the aforementioned technological field by increasing the compactness and functional efficiency of the design of the liquid cooling assembly 100 and, accordingly, of computing device 400.

FIGS. 2G and 2H demonstrate the bottom side of heat sink 150 with and without cover 156, respectively. In some embodiments, heat sink 150 may further include inner cavity 157, as shown in FIG. 2H. In some embodiments, inner cavity 157 may include a plurality of inner channels 158. Inner cavity 157 may be shaped so as to distribute the liquid coolant flow passing therethrough substantially evenly between the plurality of inner channels thereof (as shown in FIG. 4B).

In some embodiments, cover 156 may be joined to the body of heat sink 150 by brazing, soldering, friction stir welding (FSW), or any other welding technique suitable for the materials selected. It should be appreciated that the same may be applicable to cover 111 and the body of heat sink 110.

Same as inner channels 114A-114E shown in FIG. 2C, inner channels 158 may be formed by a series of separating inner walls positioned along the flow direction. This configuration not only ensures even flow distribution but also significantly increases the heat-conducting area of heat sink 110 in direct contact with the liquid coolant flow, thereby enhancing heat dissipation efficiency.

In some embodiments, heat sink 150 may further include inlet communication channel (e.g., nipple 154B) and outlet communication channel (e.g., nipple 154A), fluidically connected to inner cavity 157 so that the liquid coolant flow, incoming from inlet communication channel (e.g., nipple 154B) into cavity 157, would pass through the set of inner channels 158 before exiting through outlet communication channel (e.g., nipple 154A). Nipples 154A and 154B and openings 117F and 117E of heat sink 110 (shown in FIG. 2E) may be configured so that, in the assembled state, nipples 154A and 154B are inserted into openings 117F and 117E, respectively. Each of nipples 154A and 154B may include an annular groove (not shown) and optionally a sealing element such as an elastic O-ring positioned inside the groove (O-rings 154A1 and 154B1, respectively). In some embodiments, O-rings 154A1 and 154B1 may have an outer diameter larger than the diameter of openings 117F and 117E, thereby being configured to seal the gaps between the outer wall of nipples 154A and 154B and the inner walls of openings 117F and 117E, respectively, in the assembled state.

Accordingly, in some embodiments, the inlet and outlet communication channels (e.g., nipples 154A and 154B) may be in permanent connection to inner cavity 157 of heat sink 150 and configured to provide, in the assembled state, a detachable fluid-tight connection to inner cavity 116 of heat sink 110.

It shall be understood that, in some alternative embodiments, said inlet and outlet communication channels (e.g., nipples 154A and 154B) may be in permanent connection to inner cavity 116 of heat sink 110 and configured to provide, in the assembled state, a detachable fluid-tight connection to inner cavity 157 of heat sink 150. In some further alternative embodiments, one of said inlet and outlet communication channels (e.g., nipples 154A and 154B) may be in permanent connection to one of inner cavities 116 and 157 and another of said inlet and outlet communication channels (e.g., nipples 154A and 154B) may be in permanent connection to another of inner cavities 116 and 157, and, respectively, each of said inlet and outlet communication channels (e.g., nipples 154A and 154B) may provide the fluid-tight connection with the respective one of cavities 116 and 157, in the assembled state.

It should be understood that the use of nipples (e.g., nipples 154A and 154B) as inlet and outlet communication channels, as described in some embodiments herein, is merely exemplary. Other fluid-connecting structures—such as hoses, couplings, quick-connect fittings—may likewise be employed, depending on the design and functional requirements. Accordingly, the present disclosure is not limited to any particular type or configuration of inlet and outlet communication channels.

As described above with reference to FIG. 2A, PCB 200 may include mounting openings 220A and 220B, and, in the assembled state, inner cavity 116 may be configured to be fluidically connected to inner cavity 157 via nipples 154A and 154B, through mounting openings 220A and 220B, respectively.

Such a configuration of fluidic connection between heat sinks 110 and 150 may provide an improvement to the aforementioned technological field by ensuring highly efficient heat dissipation for electronic components located on opposite sides of PCB 200, while maintaining overall integrated design efficiency and compactness of the design of the liquid cooling assembly 100, as well as of the computing device 400. In particular, this improvement can be achieved by providing a fluidic connection between heat sinks 110 and 150 such as through openings 220A and 220B of PCB 200, and configuring heat sinks 110 and 150 to share a common inlet and outlet connection to the liquid coolant distribution unit (e.g., through fittings 141A and 141B).

Additionally or alternatively, in some embodiments, recesses formed in PCB 200 may be used in place of mounting openings 220A and 220B. It shall be appreciated that other structural configurations functionally equivalent to mounting openings 220A and 220B or recesses—such as passages, channels, ports, mounting interfaces, sockets, and the like—may also be employed without going beyond the scope of the present invention.

As used herein, the term "opening" may refer to a through-hole or passage that extends entirely through the body of the printed circuit board (e.g., PCB 200), typically enclosing the inserted element (e.g., nipples 154A and 154B) along its full perimeter. In contrast, a "recess" may refer to a partial cutout or indentation, such as a semicircular or U-shaped notch formed at the edge of the PCB (e.g., PCB 200), which accommodates the element without fully surrounding it. While both configurations allow for the positioning or mounting of components, a recess may not define a fully enclosed boundary around the inserted element.

It should be understood that, although in FIG. 2H the elements positioned inside cavity 157, such as channels 158, appear without a bottom wall (heat sink 150 is shown upside down), heat sink 150 may be configured so that, when covered with cover 156 (as shown in FIG. 2G), the bottom wall of these elements is formed by the inner side of cover 156. Accordingly, with cover 156 in place, each of channels 158 may have a closed or substantially closed shape (e.g., rectangular) in cross-section.

As shown in FIG. 2F, from the top side, heat sink 150 may further include contact surfaces 155A and 155B, configured so as to be thermally coupled with heat dissipating areas of respective ancillary electronic components 223 and 224, assembled on the bottom side of PCB 200. As shown in FIG. 2F, contact surfaces 155A and 155B may be formed as recesses made in the outer surface of heat sink 150, so that the heat dissipating areas of components 223 and 224, in the assembled state, may be thermally coupled to heat sink 150, close to the upper wall of channels 158, to improve heat dissipation efficiency.

Figure 2L:
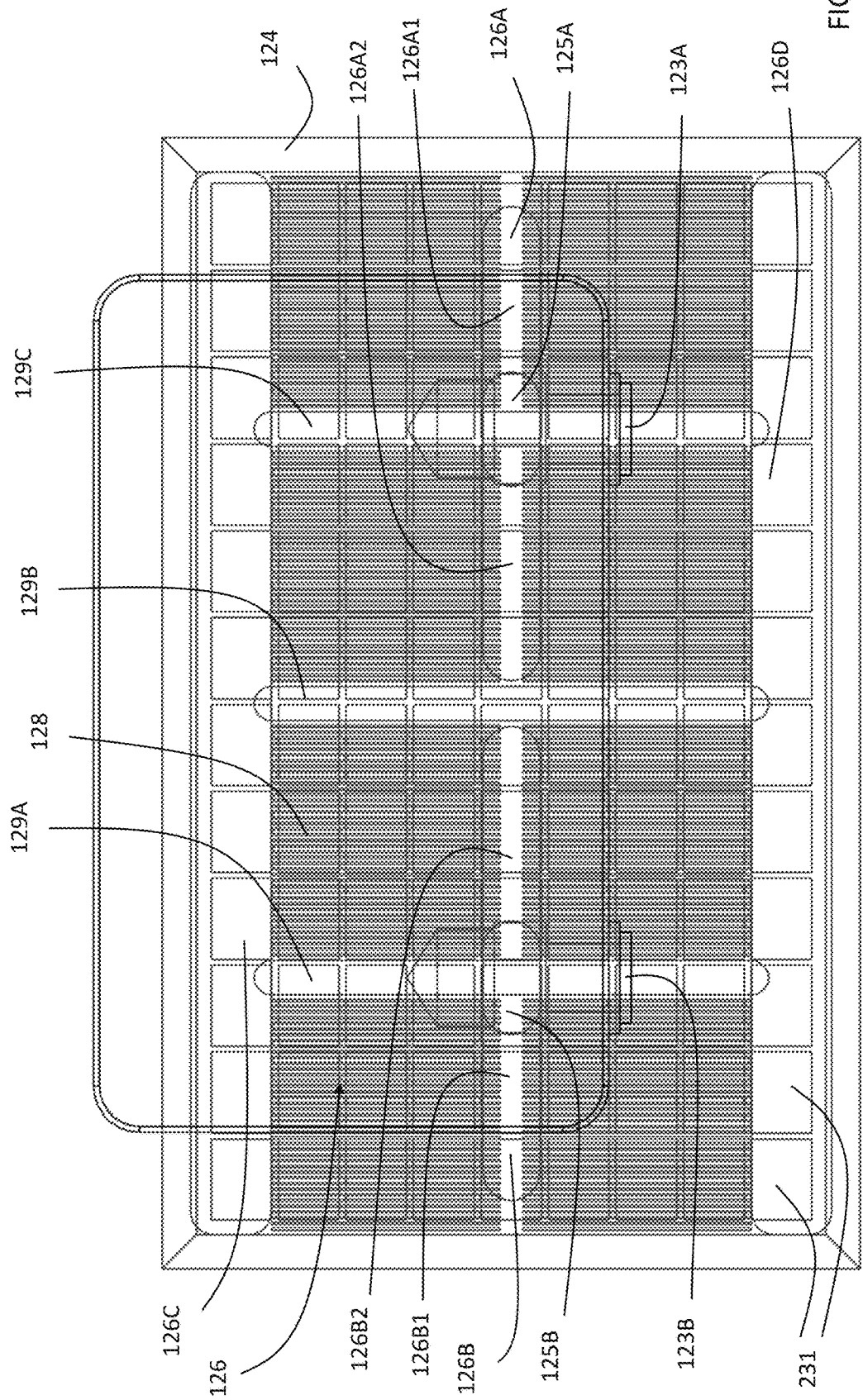
FIG. 2L is a partial top view of the second heat sink (shown transparent), according to some embodiments of the present invention.
Figure 3A:
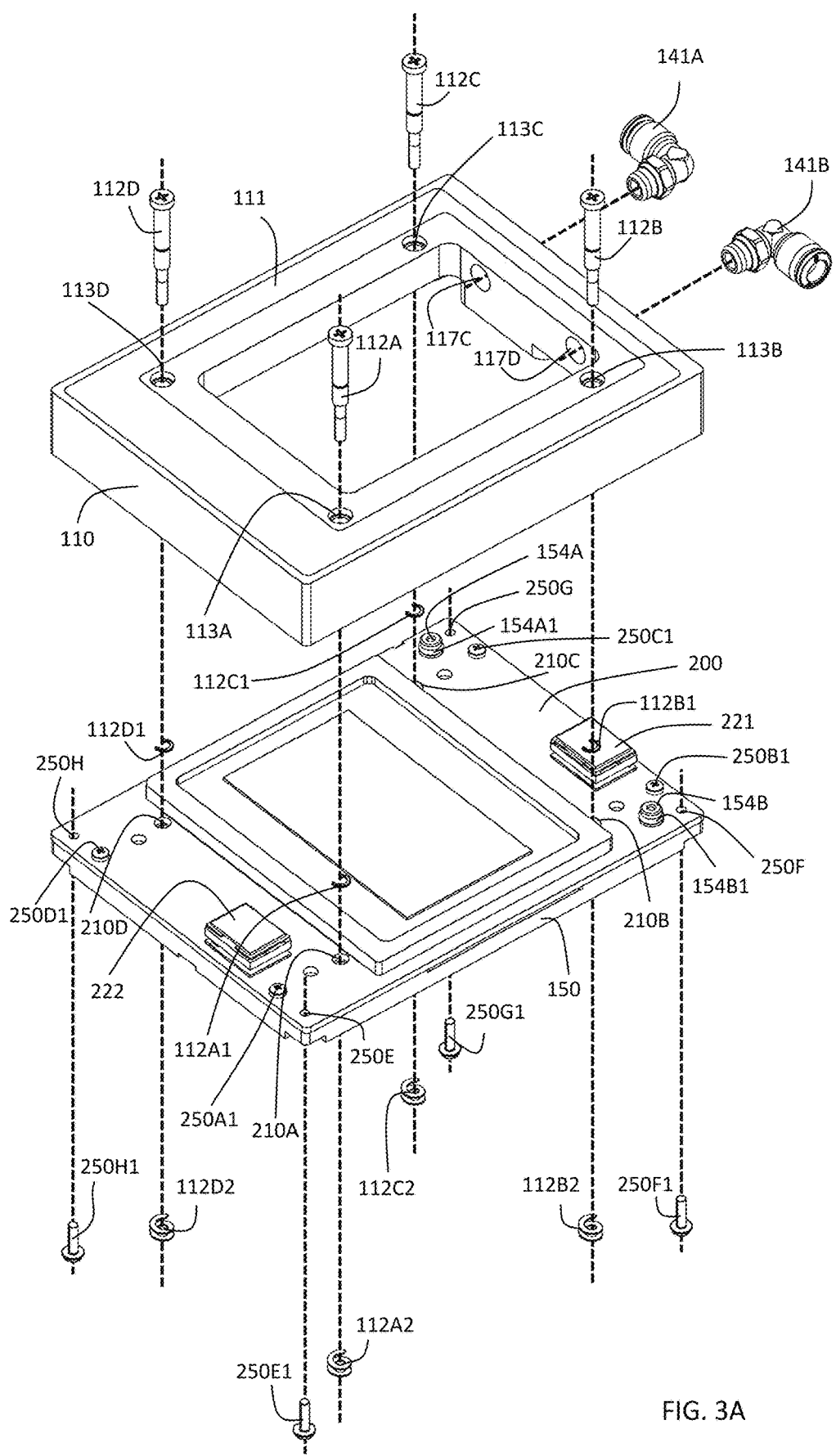
FIG. 3A is an exploded view of the liquid cooling assembly and the computing device, showing connection of the first heat sink to the PCB, according to some embodiments of the present invention.
Figure 3B:
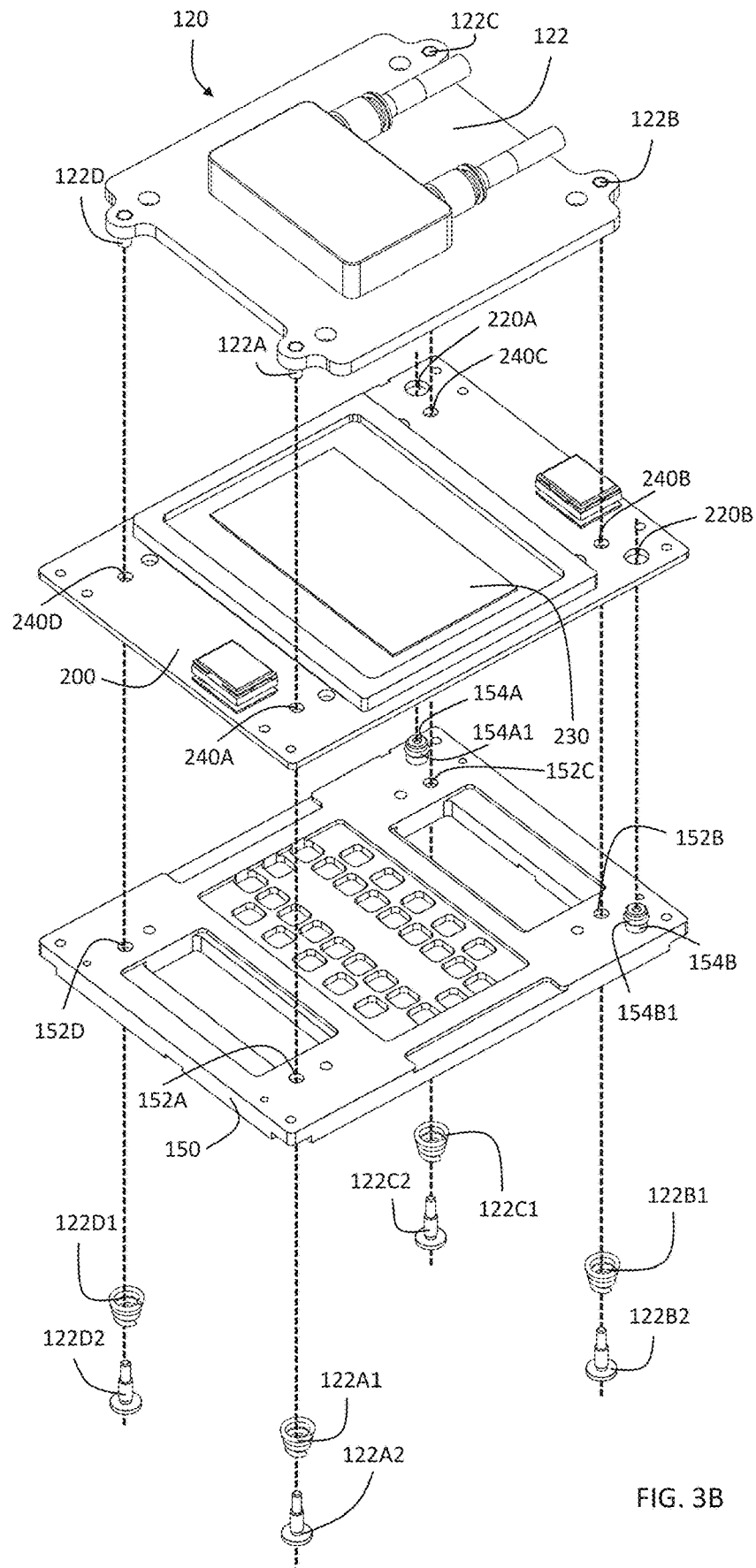
FIG. 3B is an exploded view of the liquid cooling assembly and the computing device, showing connection of the second and third heat sinks to the PCB, according to some embodiments of the present invention.

Reference is now made to FIGS. 2I-2L. FIG. 2I illustrates an isometric view of the top side of heat sink 120, FIG. 2J illustrates a front view of heat sink 120 (shown transparent), FIG. 2K illustrates a side view of heat sink 120 (shown transparent), and FIG. 2L illustrates a partial top view of heat sink 120 (shown transparent) according to some embodiments of the present invention.

Heat sink 120 may include portions 121 and 122. As shown in FIG. 2J, portion 121 may include inlet and outlet openings 123B and 123A, respectively, for directing the liquid coolant into and out of inner cavity 126 (shown in FIG. 2L), which is positioned inside portion 122. As shown in FIG. 2I, inlet and outlet openings 123B and 123A may be attached via fittings 131B and 131A to flexible tubes 132B and 132A, respectively. From another end, flexible tubes 132B and 132A may be connected, via fittings 133B and 133A, to sections 116A and 116C of inner cavity 116 of heat sink 110, respectively (as shown in FIG. 1).

As shown in FIGS. 2J and 2K, in some embodiments, from the bottom side, portion 122 may include contact surface 124 and may be configured to be thermally coupled with heat dissipating area of IC 230 of PCB 200 (shown in FIG. 2A) via surface 124. In particular, contact surface 124 may be sized according to the dimensions of IC 230, and portion 122 of heat sink 120 may be thermally coupled to IC 230, e.g., via thermal paste 231 covering heat-dissipating area thereof.

In contemporary high-performance computing solutions, ICs may consume power levels of up to 1500 W, while requiring operating temperatures to remain below 90° C. for proper functionality. Given their relatively small physical dimensions, these conditions present significant thermal management challenges. For such cases, to provide efficient heat dissipation, it would be advantageous if heat sinks are substantially in direct contact with the heat-dissipating area of the IC and are firmly pressed against it, rendering the usage of thermal pads for such solutions inapplicable. In some embodiments, the contact surfaces of the heat sinks are polished to a surface roughness adaptable to that of the IC. For example, the upper surface of IC 230 may be made with a surface roughness of approximately 30 microns. In some embodiments, the contact surface 124 of heat sink 120 may also be polished to achieve similar roughness. In such cases, when the heat-dissipating area of IC 230 is in direct contact with the contact surface 124 of heat sink 120, maximum gaps therebetween may be up to 60 microns. To provide proper heat dissipation, such gaps may be filled with thermally conductive material, such as thermal paste (e.g., thermal paste 231, shown in FIGS. 2J-2L).

Thermal paste, also known as thermal compound or thermal grease, is a substance applied between a heat-generating component (like a CPU or GPU) and a heat sink. Its primary function is to fill microscopic imperfections on the surfaces of these components, ensuring better thermal conductivity and efficient heat transfer. This helps maintain optimal operating temperatures and prevents overheating, thereby enhancing the performance and longevity of electronic devices.

The aforementioned heat dissipation challenges related to ICs further necessitate the use of mechanically isolated groups of tightening elements to press heat sinks 110, 120, and 150 onto the heat-dissipating areas of respective electronic components, as suggested herein. In particular, the use of such fastening elements as spring-loaded screws 122A2-122D2 to secure heat sink 120 allows for substantially uniform, predefined pressure on the heat-dissipating area of IC 230 when tightened (as shown in FIG. 3B), while the flexible fluid connection between heat sink 110 and heat sink 120 helps mitigating misalignment between IC 230 and components 221-222, followed by required misalignment between heat sinks 110 and 120. When the fastening elements (e.g., screws 122A2-122D2) are tightened and the resilient elements (e.g., springs 122A1-122D1) are compressed, the thermal paste may spread, filling the gaps between the contact surface 124 and the heat-dissipating area of IC 230, thereby providing proper thermal coupling between them.

As shown in FIGS. 2J and 2K, portion 121 may have inner channel connecting openings 123B and 123D and thereby configured to direct liquid coolant flow, received through opening 123B, to inner cavity 126 (shown in FIG. 2L). Portion 121 may further have inner channel connecting openings 123A and 123C and thereby configured to direct liquid coolant flow from cavity 126 to inner cavity 116 via opening 123A.

Inner cavity 126 may be sized according to the dimensions of IC 230. Cavity 126 may have a symmetrical configuration divided into four sections separated by walls 129A-129C. Each of these sections may include two subsections separated by transverse channels 126A1, 126A2 and 126B1 and 126B2, respectively. Portion 121 may be connected to portion 122 via inlet opening 125B and outlet opening 125A, each of which is coupled to transverse channels 126B and 126A, respectively. Channel 126B may be configured to distribute the flow substantially evenly between channels 126B1 and 126B2, and channel 126A may be configured to distribute the flow substantially evenly between channels 126A1 and 126 A2. Each of the subsections may include a plurality of longitudinal inner channels separated by longitudinal walls 128 (also may be referred to as "fins"), thereby increasing the surface area for heat transfer. From the two sides of cavity 126, said sections are connected via transverse channels 126C and 126D. Accordingly, in such configuration, each of openings 125A and 125B is adjacent to the respective pair of sections of cavity 126. In other words, inner cavity 126 is configured to provide fluid connection between openings 125A and 125B through the plurality of longitudinal inner channels and transverse channels 126C and 126D.

As shown in FIGS. 2I-2K, at the corners of portion 122, heat sink 120 may have standoffs 122A-122D, as explained in detail with reference to FIG. 3B. Portion 122 may also include openings 127A-127D for connecting computing device 110 to the mother board via fastening elements (e.g., screws 112A-112D).

As described above, liquid cooling assembly 100 may include two heat sinks, 110 and 120, each configured to dissipate heat from respective components of PCB 200 when attached. Heat sinks 110 and 120 are flexibly fluidically connected via tubes 132A and 132B, allowing them to move freely relative to each other. This flexibility may compensate for mechanical tolerances of the respective components (e.g., tolerances between IC 230 and ancillary components 221-225).

To leverage the benefits of this flexible connection, it is further suggested herein that heat sink 110 and heat sink 120 are each configured to be thermally coupled to respective components of PCB 200 by being pressed onto heat-dissipating areas thereof (e.g., via thermal pads, as explained above) using mechanically isolated groups of tightening elements.

The term "mechanically isolated" is used herein to describe a configuration in which each group of tightening elements is designed and configured to adjust the pressure and positioning of a respective heat sink (110 or 120) without affecting the pressure and positioning of the other heat sink (120 or 110, respectively).

These aspects of positioning are further explained with reference to FIGS. 3A and 3B.

FIG. 3A shows an exploded view of liquid cooling assembly 100 (computing device 400), showing aspects of connection of heat sink 110 to PCB 200.

As explained above, computing device 400 may be secured to the mother board (not shown) using fastening elements (e.g., screws 112A-112D). Each of screws 112A-112D may be connected (e.g., threaded) through respective opening 113A-113D of heat sink 110, then may be coupled with one of retaining rings 112A1-112D1, respectively. Next, screws 112A-112D may be threaded through openings 210A-210D of PCB 200 and openings 151A-151D of base member 150 (shown in FIG. 2F), respectively. Finally, screws 112A-112D may be fixed, from the bottom side of base member 150 with coiled spring washers 112A2-112D2, respectively. Spring washers 112A2-112D2 may facilitate disconnection of computing device 400 from the mother board (as high-speed connectors 225A and 225B, shown in FIG. 2B, may be difficult to disconnect) by pushing device 400 away from the mother board.

In some embodiments, said mechanically isolated groups of tightening elements may include a first group of fastening elements (e.g., screws 250E1-250H1) configured to fix, in the assembled state, heat sink 110 to heat sink 150 through the first group of mounting openings of heat sink 150 (e.g., openings 153E-153H, as shown in FIG. 2F) and a respective group of mounting openings of PCB 200 (e.g., openings 250E-250H). Said first group of fastening elements (e.g., screws 250E1-250H1) may be further configured to substantially uniformly press heat sink 110 (via contact surfaces 119A and 119B) onto the heat-dissipating areas of ancillary components 221 and 222, when being tightened.

As further shown in FIG. 3A, inlet and outlet fittings 141B and 141A may be connected to heat sink 110 via openings 117B and 117A, respectively.

Heat sink 150 may be secured to PCB using fastening elements (e.g., screws 250A1-250D1), via openings 250A-250D of PCB 200 (shown in FIG. 2A) and openings 153A-153D (e.g., threaded openings) of heat sink 150 (shown in FIG. 2F).

FIG. 3B shows an exploded view of liquid cooling assembly 100 and computing device 400, showing connection of heat sink 120 and heat sink 150 to PCB 200.

In some embodiments, said mechanically isolated groups of tightening elements may include a second group of fastening elements (e.g., spring-loaded screws 122A2-122D2) configured to fix, in the assembled state, heat sink 120 to base member 150 through the second group of mounting openings 152A-152D of base member 150 and the respective group of mounting openings of PCB 200 (e.g., openings 240A-240D). Said second group of fastening elements (e.g., screws 122A2-122D2) may be further configured to substantially uniformly press heat sink 120 (via contact surface 124, shown in FIGS. 2J-2K) onto the heat-dissipating area of IC 230, when being tightened.

In some embodiments, heat sink 120 may further include a plurality of standoffs 122A-122D distancing, in the assembled state, a heat sink 120 from the surface of PCB 200 and comprising openings (not shown) configured to receive fastening elements of the second group (e.g., screws 122A2-122D2), respectively. In some embodiments, standoffs 122A-122D and said spring-loaded screws 122A2-122D2 are configured so as to avoid mechanical interference with PCB 200. Accordingly, in order to thermally couple heat sink 120 to IC 230, fastening elements (e.g., screws 122A2-122D2) may be coupled with resilient elements (e.g., springs 122A1-122D1) and through openings 152A-152D (e.g., threaded) of base member 150 and openings 240A-240D of PCB 200, respectively. Finally, screws 122A2-122D2 may be screwed into the threaded openings of standoffs 122A-122D and tightened until the proper contact between contact surface 124 and heat dissipating surface of IC 230 is achieved.

Thereby, the abovementioned mechanically isolated coupling of heat sink 110 and heat sink 120 to respective components of PCB 200 may be achieved, leveraging the benefits of flexible fluid connection between heat sinks 110 and 120 and thereby providing the desired mitigation of mechanical tolerances between these components.

Additionally, in some embodiments, to avoid undesired mechanical interferences, the diameters of standoffs 122A-122D and the fastening elements (e.g., screws 122A2-122D2) may be made smaller than the diameters of the respective mounting openings (e.g., openings 240A-240D). This adjustment may help to avoid or minimize contact between the mounting elements and PCB 200.

As can be seen in FIGS. 3A and 3B, when heat sinks 110 and 150 are being attached to PCB 200, nipples 154A and 154B may be threaded through openings 220A and 220B of PCB 200 and inserted into openings 117F and 117E of heat sink 110 (shown in FIG. 2E), respectively, providing detachable fluid-tight connection between heat sinks 110 and 150, as explained above.

It should be understood that the use of screws as fastening elements and springs as resilient elements, as described in certain embodiments (e.g., spring-loaded screws 122A2-122D2), is merely exemplary. Other types of fastening elements (e.g., clamps, bolts, rivets, or latches) and resilient elements (e.g., elastomeric pads, leaf springs, or Belleville washers) may likewise be employed, depending on the specific design requirements and material compatibility. Accordingly, the present disclosure is not limited to any particular type of fastening or resilient mechanism.

FIG. 4A shows a top view of liquid cooling assembly 100 having heat sink 110 shown partially transparent, illustrating the first liquid coolant circulation pathway, according to some embodiments of the present invention.

According to a concept of some embodiments of the present invention, in some embodiments, inner cavity 116 of heat sink 110 may be fluidically connectable to the liquid coolant distribution unit 300 (shown schematically) and configured to form therewith a first liquid coolant circulation pathway.

As shown in FIG. 4A, the liquid coolant flow 301 may enter liquid cooling assembly 100 via fitting 141B. Next, in section 116A of cavity 116, the flow may be divided into three flows—the first is then directed through inner cavity 116 of heat sink 110, the second is directed through inner cavity 157 of heat sink 150, and the third is directed through inner cavity 126 of heat sink 120, thereby forming said three liquid coolant circulation pathways. The first liquid coolant circulation pathway is shown with dashed lines and arrows.

Following the first liquid coolant circulation pathway, the flow enters section 116B via input channel 115A. Inside section 116B flow 331, formed after passing channel 151A, is separated into a plurality of flows 312 passing through inner channels 114A. Next, the flow is separated into plurality of flows 313, that form plurality of flows 314 passing through inner channels 114B. As can be seen, the walls of inner channels vary in length. The suggested configuration provides for efficient, substantially uniform separation of flows 313 between inner channels 114B. After passing channels 114B, flows 315 are deflected to form flows 316 substantially uniformly separated between inner channels 114C. After that, flows 317 are deflected by protrusions 118C and 118D and, through output channel 115B, exit section 116B and enter section 116C. In section 116C, the flows are mixed with the output flows from the second and third liquid coolant circulation pathways (the ones going through heat sinks 150 and 120, respectively) to form flow 302 that exits the liquid cooling assembly via common outlet connection—fitting 141A. It shall be understood that sections 116A and 116C are separated by inner wall 114F.

FIG. 4B shows an isometric view of liquid cooling assembly 100 having heat sink 110 illustrated partially, and heat sink 150 illustrated partially transparent. FIG. 4B demonstrates the second liquid coolant circulation pathway, according to some embodiments of the present invention.

In some embodiments, inner cavity 157 of heat sink 150 may be in fluid connection with inner cavity 116 of heat sink 110 and configured to form, together with liquid coolant distribution unit 300 (shown schematically), a second liquid coolant circulation pathway, while sharing, with the first liquid coolant circulation pathway, a common inlet and outlet connection (via openings 117A and 117B and fittings 141A and 141B to liquid coolant distribution unit 300).

Following the second liquid coolant circulation pathway, flow 321 may go through opening 117E and nipple 154B and enter inner cavity 157 of heat sink 150. Then, the flow may be directed, by the inner walls of cavity 157, through the set of inner channels 158, while being substantially uniformly distributed therebetween, forming flows 324. After passing channels 158, flows 324 may form flows 325 which are then mixed to form flow 326. Then, flow 326 may exit cavity 157 via nipple 154A. Next, via opening 117F, flow 327 may enter section 116C of inner cavity 116, where it is mixed with the output flows from the first and third liquid coolant circulation pathways (the ones going through heat sinks 110 and 120, respectively) to form flow 302 that exits the liquid cooling assembly via common outlet connection—fitting 141A.

FIG. 4C shows an isometric view of liquid cooling assembly 100 having heat sink 120 illustrated partially transparent. FIG. 4C demonstrates the third liquid coolant circulation pathway, according to some embodiments of the present invention.

In some embodiments, inner cavity 126 of heat sink 120 may be in flexible fluid connection with inner cavity 116 of heat sink 110 and configured to form, together with liquid coolant distribution unit 300 (shown schematically), a third liquid coolant circulation pathway, while sharing, with the first liquid coolant circulation pathway and the second liquid coolant circulation pathway, a common inlet and outlet connection (via openings 117A and 117B and fittings 141A and 141B to liquid coolant distribution unit 300).

Following the third liquid coolant circulation pathway, flow 331 goes through tube 132B and, through opening 125B, enters inner cavity 126. Then, the flow goes through transverse channel 126B and divides into multiple sub-flows passing through longitudinal inner channels separated by longitudinal walls 128 in opposite longitudinal directions. After passing through longitudinal inner channels, flows are mixed again (e.g., flows 332 and 333) and are directed through transverse channels 126C and 126D. After passing channels 126C and 126D, flows are again divided into multiple sub-flows (e.g., flows 334) passing through the longitudinal inner channels. Next, flows 334 are again mixed inside transverse channel 126A and exit inner cavity 126 via opening 125A. After that, flow 335 is directed via tube 132A to section 116C, wherein it is mixed with the flows of the first and second liquid coolant circulation pathways. Finally, the liquid coolant flow 302 exits the liquid coolant assembly 100 via common outlet connection—opening 117A and—fitting 141A.

According to the concept of the present invention, the size and position of channels 115A and 115B, and openings 117E and 117F may be one of the key aspects of liquid cooling efficiency. As the separation between the liquid cooling circulation pathways may be performed passively, it may be preset by the ratio in which flow 301 is divided into first, second and third liquid coolant circulation pathways. Accordingly, liquid cooling assembly 100 may be further configured to split an input liquid coolant flow 301 between said first liquid coolant circulation pathway, said second liquid coolant circulation pathway, and said third liquid coolant circulation pathway in the predefined ratio.

In some embodiments, said ratio may be determined at the design stage, corresponding to an expected power consumption ratio between the respective components of PCB 200, e.g., between IC 230, the group of ancillary components 223-224, and the group of ancillary components 221-222.

It shall be understood that, depending on embodiments, said ratio may vary significantly. E.g., in some power-intensive embodiments, the expected power consumption of IC 230 may be up to 1200 W, the power consumption of ancillary components 221-222 may be up to 200 W, and the power consumption of ancillary components 223-224 may be up to 100 W. Accordingly, said ratio may be 2:1:12.

Accordingly, to provide the desired ratio, input channel of heat sink 110 (e.g., input channel 115A), input channel of heat sink 150 (e.g., opening 117E) and the input channel of heat sink 120 (e.g., opening 125B) may be sized corresponding to said predefined ratio. Furthermore, to provide the desired ratio, output channel of heat sink 110 (e.g., output channel 115B), output channel of heat sink 150 (e.g., opening 117F), and the output channel of heat sink 120 (e.g., opening 125B) may be sized corresponding to said predefined ratio.

At the design stage, the input data for designing the liquid cooling assembly 100 may include the quantity and layout of the IC and critical ancillary components that require heat management, as well as their expected power consumption. The dimensions of input channels 115A and 115B, and openings 117E and 117F can then be determined in relation to the sizes of openings 125A and 125B, corresponding to the ratio of the expected power consumption. The required flow rate of fittings 141A and 141B can, in turn, be determined based on the maximum value of the power consumption.

Thereby, the suggested invention further contributes to the improvement of the relevant technological field by simplifying manufacturing process for producing customized liquid cooling assembles.

One common problem in liquid fluid circulation systems is airlock. Airlock occurs when air gets trapped in the system, often in the upper sections, preventing the proper flow of liquid. This effect can significantly hinder the system's efficiency and cooling performance.

To avoid airlock issues, it is suggested that the input channel 115A and output channel 115B of heat sink 110 be positioned adjacent to the upper wall of inner cavity 116. For example, in the illustrated embodiment, channels 115A and 115B have a rectangular cross-section, with the upper wall formed by cover 111. This arrangement allows channels 115A and 115B to be adjacent to the upper wall, effectively mitigating airlock issues. Air bubbles that may enter cavity 116 will easily pass through and exit the liquid cooling assembly.

The same concept may be further applicable to heat sinks 120 and 150. As openings 125A and 125B may be made in the upper wall of inner cavity 126 (and therefore adjacent thereto), as shown, for example, in FIGS. 2J and 2K, the airlock issue may be effectively mitigated. The same is relevant for the configuration of nipples 154A and 154B, as they may be coupled to the upper wall of inner cavity 157 (as shown in FIG. 2H).

Accordingly, the described configuration of liquid cooling assembly 100 may effectively apply heat sinks 110, 150 and 120 to dissipate heat from the components of PCB 200 and transfer it to the liquid media (also referred herein as "liquid coolant") through convection and radiation.

In some embodiments, the liquid coolant may include water, glycol mixtures, and/or dielectric fluids as commonly known in the art, or other liquids having high thermal conductivity and heat capacity.

It should be understood that all discussions related to flow directions, including terms such as "input," "output," "inlet," "outlet," "enter," "exit," and similar, are provided for clarity only and should not be considered as limiting the scope of the present invention. Accordingly, in some embodiments, flow directions may be reversed, and all relevant elements should be considered as providing the opposite function, e.g., "outputting" instead of "inputting," etc.

As can be seen from the provided description, the present invention represents a liquid cooling assembly that provides an improvement to the technological field of microelectronics and electronic engineering. Specifically, the invention represents an effective cooling solution for systems employing vertical power delivery and provides liquid cooling for electronic components located on both sides of the PCB while fitting within the spatial constraints of modern electronic devices. The suggested solution is easily adjustable to mitigate mechanical tolerances between the different electrical components of the target PCB and adaptable to address the diverse thermal loads presented by them, while maintaining the compactness of the design. The provided invention increases the overall heat dissipation efficiency of thermal management systems and represents a substantial advancement in thermal management technology for next-generation computing systems. The invention further provides a computing device that includes such an improved liquid cooling assembly, thereby improving the aforementioned technological field by increasing device operation efficiency, specifically enabling prolonged and stable operation in computationally intensive regimes due to highly efficient thermal management.

Unless explicitly stated, the method embodiments described herein are not constrained to a particular order or sequence. Furthermore, all formulas described herein are intended as examples only and other or different formulas may be used. Additionally, some of the described method embodiments or elements thereof may occur or be performed at the same point in time.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

The invention claimed is:

1. A liquid cooling assembly, comprising:
at least one first heat sink, configured to be thermally coupled to at least one first electronic component; and
at least one second heat sink, configured to be thermally coupled to at least one second electronic component;
said at least one first heat sink and said at least one second heat sink being configured to be assembled on opposite faces of a printed circuit board (PCB), respectively;
said at least one first heat sink having an inner cavity fluidically connectable to a liquid coolant distribution unit and configured to form therewith a first liquid coolant circulation pathway;
wherein said at least one second heat sink comprises an inner cavity configured to be fluidically connected to the inner cavity of said at least one first heat sink via an inlet communication channel and an outlet communication channel, through at least one mounting opening or at least one recess of the PCB, and to form, together with the liquid coolant distribution unit, a second liquid coolant circulation pathway, while sharing, with the first liquid coolant circulation pathway, a common inlet and outlet connection to the liquid coolant distribution unit, when the liquid cooling assembly is in an assembled state.

2. The liquid cooling assembly of claim 1, wherein each of said inlet communication channel and said outlet communication channel are in permanent connection to one of (a) the inner cavity of said at least one first heat sink and (b) the inner cavity of said at least one second heat sink, and configured to provide, in the assembled state, a detachable fluid-tight connection to another of (a) the inner cavity of said at least one first heat sink and (b) the inner cavity of said at least one second heat sink, respectively.

3. The liquid cooling assembly of claim 1, further comprising at least one third heat sink, configured to be thermally coupled to at least one third electronic component;
said at least one third heat sink having an inner cavity in flexible fluid connection with the inner cavity of said at least one first heat sink and configured to form, together with the liquid coolant distribution unit, a third liquid coolant circulation pathway, while sharing, with the first and second liquid coolant circulation pathways, a common inlet and outlet connection to the liquid coolant distribution unit.

4. The liquid cooling assembly of claim 3, wherein
said at least one first heat sink has a frame-shaped structure sized corresponding to dimensions of a peripheral area of the PCB; and
said at least one third heat sink is configured to be positioned substantially within said frame-shaped structure, when the liquid cooling assembly is attached to the PCB.

5. The liquid cooling assembly of claim 4, wherein said flexible fluid connection comprises at least one flexible inlet tube and at least one flexible outlet tube fluidically connecting the inner cavity of said at least one third heat sink with the inner cavity of said at least one first heat sink from the inner side of the frame-shaped structure.

6. The liquid cooling assembly of claim 3, wherein said at least one first heat sink and said at least one third heat sink are each configured to be thermally coupled to said at least one first electronic component and said at least one third electronic component, respectively, by being pressed onto heat-dissipating areas thereof using mechanically isolated groups of tightening elements.

7. The liquid cooling assembly of claim 6, further comprising
a base member having at least two groups of mounting openings, each comprising at least one mounting opening; and
wherein said mechanically isolated groups of tightening elements comprise:
a first group of fastening elements configured to fix, in the assembled state, said at least one first heat sink to the base member through a first group of mounting openings of the base member and a respective group of mounting openings of the PCB, and to substantially uniformly press the first heat sink onto the heat-dissipating area of said at least one first electronic component, when being tightened; and
a second group of fastening elements configured to fix, in the assembled state, said at least one third heat sink to the base member through a second group of mounting openings of the base member and a respective group of mounting openings of the PCB, said second group of fastening elements including resilient elements and being configured to substantially uniformly press the third heat sink onto the heat-dissipating area of said at least one third electronic component, when being tightened.

8. The liquid cooling assembly of claim 7, wherein said at least one second heat sink is integrated into the base member.

9. The liquid cooling assembly of claim 7, wherein at least one of said first heat sink or said third heat sink comprises a plurality of standoffs distancing, in the assembled state, a respective heat sink from the PCB and comprising openings configured to receive a respective group of fastening elements.

10. The liquid cooling assembly of claim 9, wherein said standoffs and said fastening elements are configured so as avoid mechanical interference with the PCB.

11. The liquid cooling assembly of claim 7, wherein said at least one first heat sink, and said at least one second heat sink, are configured to be thermally coupled to said at least one first electronic component and said at least one second electronic component, respectively, via thermal pads attached to heat-dissipating areas thereof, and said at least one third heat sink is configured to be thermally coupled to said at least one third electronic component, via a thermal paste covering heat-dissipating area thereof.

12. The liquid cooling assembly of claim 3, further configured to split an input liquid coolant flow, passing through the common inlet connection, between said first liquid coolant circulation pathway, said second liquid coolant circulation pathway and said third liquid coolant circulation pathway in a predefined ratio.

13. The liquid cooling assembly of claim 12, wherein said predefined ratio is defined corresponding to an expected power consumption ratio between said at least one first electronic component, said at least one second electronic component, and said at least one third electronic component.

14. The liquid cooling assembly of claim 12, further configured to split the input liquid coolant flow by directing a first portion thereof through an input channel of said at least one first heat sink, a second portion thereof through an input channel of said at least one second heat sink, and a third portion thereof through an input channel of said at least one third heat sink, the input channel of said at least one first heat sink, the input channel of said at least one second heat sink, and the input channel of said at least one third heat sink being sized corresponding to said predefined ratio.

15. The liquid cooling assembly of claim 3, wherein at least one of (i) said at least one first heat sink, (ii) said at least one second heat sink, and (iii) said at least one third heat sink comprises an input channel and an output channel adjacent to an upper wall of the inner cavity of said at least one first heat sink, said at least one second heat sink, and said at least one third heat sink, respectively.

16. The liquid cooling assembly of claim 3, wherein the inner cavity of at least one of (i) said at least one first heat sink, (ii) said at least one second heat sink, and (iii) said at least one third heat sink comprises a plurality of inner channels and is shaped so as to distribute a liquid coolant flow passing therethrough substantially evenly between the plurality of inner channels thereof.

17. The liquid cooling assembly of claim 3, wherein at least one of said at least one first heat sink, said at least one second heat sink, and said at least one third heat sink is configured to be thermally coupled to said at least one first electronic component, said at least one second electronic component, and said at least one third electronic component, respectively, via a direct-to-chip (D2C) liquid cooling configuration.

18. A computing device, comprising:
a printed circuit board (PCB) comprising: (i) at least one first electronic component and at least one second electronic component mounted on opposite faces thereof, and (ii) at least one mounting opening or at least one recess;
at least one first heat sink thermally coupled to said at least one first electronic component; and
at least one second heat sink thermally coupled to said at least one second electronic component;
said at least one first heat sink having an inner cavity fluidically connectable to a liquid coolant distribution unit and configured to form therewith a first liquid coolant circulation pathway;
wherein said at least one second heat sink comprises an inner cavity fluidically connected to the inner cavity of said at least one first heat sink via an inlet communication channel and an outlet communication channel, through said at least one mounting opening or at least one recess, and to form, together with the liquid coolant distribution unit, a second liquid coolant circulation pathway, while sharing, with the first liquid coolant circulation pathway, a common inlet and outlet connection to the liquid coolant distribution unit.

19. The computing device of claim 18, wherein each of said inlet communication channel and said outlet communication channel are in permanent connection to one of (a) the inner cavity of said at least one first heat sink and (b) the inner cavity of said at least one second heat sink, and in a detachable fluid-tight connection to another of (a) the inner cavity of said at least one first heat sink and (b) the inner cavity of said at least one second heat sink, respectively.

* * * * *